(12) United States Patent
Lauermann et al.

(10) Patent No.: US 10,622,519 B2
(45) Date of Patent: Apr. 14, 2020

(54) REDUCTION OF SURFACE RECOMBINATION LOSSES IN MICRO-LEDS

(71) Applicant: Facebook Technologies, LLC, Menlo Park, CA (US)

(72) Inventors: Thomas Lauermann, Cork (IE); Stephan Lutgen, Dresden (DE); David Hwang, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/369,076

(22) Filed: Mar. 29, 2019

(65) Prior Publication Data

US 2019/0305185 A1    Oct. 3, 2019

Related U.S. Application Data

(63) Continuation-in-part of application No. 15/969,523, filed on May 2, 2018, now Pat. No. 10,468,552.
(Continued)

(51) Int. Cl.
*H01L 33/00* (2010.01)
*H01L 51/00* (2006.01)
(Continued)

(52) U.S. Cl.
CPC .......... *H01L 33/24* (2013.01); *G02B 27/0172* (2013.01); *H01L 33/44* (2013.01); *H01L 51/52* (2013.01)

(58) Field of Classification Search
CPC ......... H01L 33/24; H01L 33/44; H01L 33/30; H01L 33/005; H01L 33/03125;
(Continued)

(56) References Cited

U.S. PATENT DOCUMENTS

| 4,603,420 A | 7/1986 | Nishizawa et al. |
| 7,418,014 B2 | 8/2008 | Mochizuki |

(Continued)

FOREIGN PATENT DOCUMENTS

WO    2015086704 A1    6/2015

OTHER PUBLICATIONS

U.S. Appl. No. 15/969,523, "Corrected Notice of Allowance", dated Jun. 20, 2019, 9 pages.
(Continued)

*Primary Examiner* — Nikolay K Yushin
(74) *Attorney, Agent, or Firm* — Kilpatrick Townsend & Stockton LLP

(57) ABSTRACT

Disclosed herein are systems and methods for reducing surface recombination losses in micro-LEDs. In some embodiments, a method includes increasing a bandgap in an outer region of a semiconductor layer by implanting ions in the outer region of the semiconductor layer and subsequently annealing the outer region of the semiconductor layer to intermix the ions with atoms within the outer region of the semiconductor layer. The semiconductor layer includes an active light emitting layer. A light outcoupling surface of the semiconductor layer has a diameter of less than 10 μm. The outer region of the semiconductor layer extends from an outer surface of the semiconductor layer to a central region of the semiconductor layer that is shaded by a mask during the implanting of the ions.

20 Claims, 21 Drawing Sheets

Related U.S. Application Data

(60) Provisional application No. 62/651,044, filed on Mar. 30, 2018.

(51) Int. Cl.
*G02B 27/01* (2006.01)
*H01L 33/24* (2010.01)
*H01L 51/52* (2006.01)
*H01L 33/44* (2010.01)

(58) Field of Classification Search
CPC ......... H01L 33/25; H01L 33/20; H01L 33/00; H01L 51/52; H01L 51/44; H01L 51/5012; H01L 51/56; G02B 27/0172; G02B 27/0093; G02B 27/01
See application file for complete search history.

(56) References Cited

U.S. PATENT DOCUMENTS

| | | | |
|---|---|---|---|
| 7,518,149 B2 | 4/2009 | Maaskant et al. | |
| 7,843,982 B2* | 11/2010 | Chua | B82Y 20/00 372/49.01 |
| 8,351,479 B2 | 1/2013 | Lutgen et al. | |
| 8,384,114 B2 | 2/2013 | Tischler et al. | |
| 9,450,148 B2 | 9/2016 | Shepherd | |
| 9,484,492 B2 | 11/2016 | Bour et al. | |
| 2007/0153857 A1* | 7/2007 | Chua | B82Y 20/00 372/49.01 |
| 2009/0304039 A1 | 12/2009 | Lutgen et al. | |
| 2010/0158067 A1 | 6/2010 | Nakatsuka et al. | |
| 2012/0146066 A1 | 6/2012 | Tischler et al. | |
| 2015/0236201 A1 | 8/2015 | Shepherd | |
| 2016/0197232 A1 | 7/2016 | Bour et al. | |

OTHER PUBLICATIONS

U.S. Appl. No. 15/969,523, "Non-Final Office Action", dated Dec. 3, 2018, 12 pages.
U.S. Appl. No. 15/969,523, "Notice of Allowance", dated Jun. 17, 2019, 17 pages.
R. Aleksiejunas, et al., "Impact of Diffusivity to Carrier Recombination Rate in Nitride Semiconductors:From Bulk GaN to (In,Ga)N Quantum Wells", Japanese Journal of Applied Physics 52, 08JK01, vol. 52, No. 8S, http://dx.doi.org/10.7567/JJAP.52.08JK01, May 20, 2013, 5 pages.
K. Bulashevich, et al., "Impact of Surface Recombination on Efficiency of III-Nitride Light-Emitting Diodes", Phys. Status Solidi RRL, 1-5, DOI: 10.1002/pssr.201600059, Jun. 2016, 5 pages.
S. Chen, et al., "Electrically Pumped Continuous-Wave III-V Quantum Dot Lasers on Silicon", Nature Photonics, DOI: 10.1038/NPHOTON.2016.21, Mar. 7, 2016, 6 pages.
T. Frost, et al., "High Performance Red-emitting Multiple Layer InGAN/GAN Quantum Dot Lasers", Japanese Journal of Applied Physics vol. 55, 032101, Feb. 5, 2016, 4 pages.
K. Lee, et al., "SiNx-Induced Intermixing in AlInGaAs/InP Quantum Well Through Interdiffusion of Group III Atoms", Journal of Applied Physics, 093109, vol. 112, Issue 9, Nov. 2012, 5 pages.
S. Lutgen, et al., "Recent Results of Blue and Green InGaN Laser Diodes for Laser Projection", Proceedings of SPIE, vol. 7953, Feb. 16, 2011, 13 pages.
M. Peter, et al., "LED Epitaxy Technology and Packaging Trends", OSRAM, Opto Semiconductors, EBV-Lighting Academy, Frankfurt, Mar. 16, 2016, 48 pages.
P. Scajev, et al., "Diffusion-Limited Nonradiative Recombination at Extended Defects in Hydride Vapor Phase Epitaxy GaN Layers", Applied Physics Letters, vol. 98, Issue 20, May 19, 2011, 4 pages.
D. Schiavon, et al., "Wavelength-Dependent Determination of the Recombination Rate Coefficients in Single-Quantum-Well GaLnN/GaN Light Emitting Diodes", Phys. Status Solidi B vol. 250, No. 2, Nov. 28, 2012, 8 pages.
C. Shen, et al., "Enabling Area-Selective Potential-Energy Engineering in InGaN/GaN Quantum Wells by Post-Growth Intermixing", Optics Express, vol. 23, No. 6, Mar. 23, 2015, 8 pages.
H. Stanchu, et al., "High-Resolution X-Ray Diffraction Analysis of Strain Distribution in GaN Nanowires on Si(111) Substrate", Nanoscale Research Letters, vol. 10, No. 51, Feb. 6, 2015, 5 pages.
A. Yadav, et al., "AlGaInP Red-Emitting Light Emitting Diode Under Extremely High Pulsed Pumping", Proc. of SPIE, 97681K-1, vol. 9768, Mar. 8, 2016, 7 pages.
Y. Zhao, et al., "Toward Ultimate Efficiency: Progress and Prospects on Planar and 3D Nanostructured Nonpolar and Semipolar InGaN Light-Emitting Diodes", Advances in Optics and Photonics, vol. 10, No. 1, Mar. 2018, 63 pages.
U.S. Appl. No. 15/824,970, "Optical Waveguides in Micro-Led Devices", filed Nov. 28, 2017, 44 pages.
U.S. Appl. No. 16/369,059, "Non-Final Office Action", dated Aug. 9, 2019, 18 pages.
U.S. Appl. No. 16/369,069, "Non-Final Office Action", dated Aug. 12, 2019, 11 pages.
Walker, "Minority Carrier Diffusion Lengths and Mobilities in Low-Doped n-InGaAs for Focal Plane Array Applications", Infrared Technology and Applications XLIII, Jul. 25, 2017, pp. 1-9.

* cited by examiner

1300

| Depth | 200 nm | 600 nm | 1000 nm |
|---|---|---|---|
| Energy H | 20 | 80 | 140 |
| Rp | 196 | 605 | 1060 |
| Depths straggle | 64 | 112 | 134 |
| Radial | 140 | 350 | 600 |
| Radial straggle | 60 | 150 | 400 |

| Depth | 200 nm | 600 nm | 1000 nm |
|---|---|---|---|
| Energy He | 30 | 120 | 300 |
| Rp | 198 | 585 | 1040 |
| Depths straggle | 81 | 140 | 165 |
| Radial | 160 | 350 | 500 |
| Radial straggle | 60 | 120 | 250 |

FIG. 13B

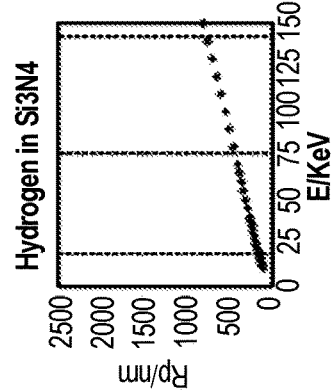
FIG. 14A  FIG. 14B  FIG. 14C
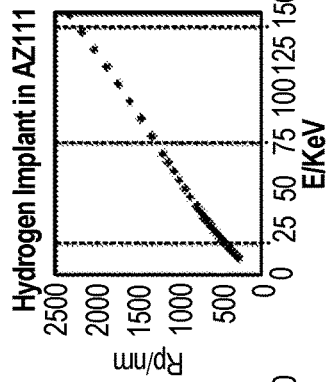
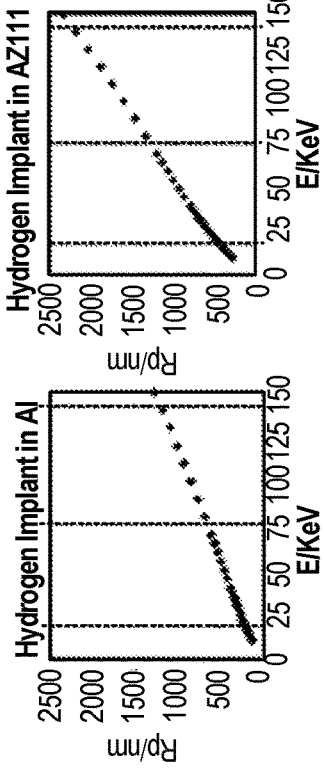
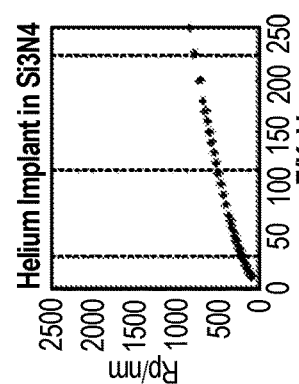
FIG. 14D  FIG. 14E
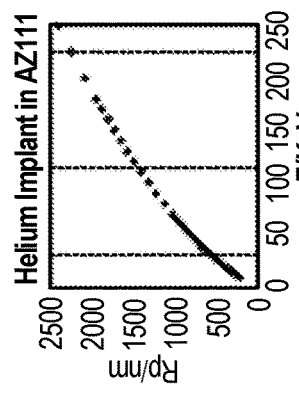
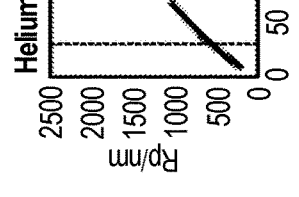
FIG. 14F  FIG. 14G  FIG. 14H
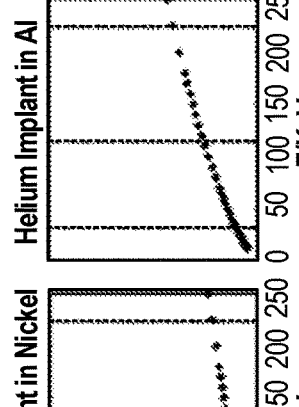
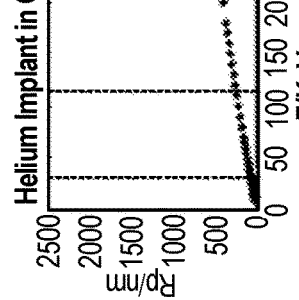

REDUCTION OF SURFACE RECOMBINATION LOSSES IN MICRO-LEDS

CROSS-REFERENCE TO RELATED APPLICATIONS

This application is a continuation-in-part application of U.S. patent application Ser. No. 15/969,523, filed on May 2, 2018, which claims priority under 35 U.S.C. § 119 to U.S. Provisional Patent Application No. 62/651,044, filed on Mar. 30, 2018, the contents of which are hereby incorporated by reference in their entireties.

BACKGROUND

A micro-LED has a very small chip size. For example, a linear dimension of the chip may be less than 50 µm or less than 10 µm. The linear dimension may be as small as 2 µm or 4 µm.

Lateral diffusion of electrons may reduce the efficiency of micro-LEDs. When current is injected into an LED, electrons diffuse in many directions. Because of the small size of micro-LEDs, most of the electrons are lost at an interface of the micro-LED in a process known as surface recombination. These lost electrons cannot contribute to the generation of light by the micro-LED. This effect becomes especially pronounced when the diffusion length of the electrons approaches the linear dimension of the chip of the micro-LED.

SUMMARY

The present disclosure generally relates to reducing surface recombination losses in micro-LEDs. In some embodiments, a method includes increasing a bandgap in an outer region of a semiconductor layer by implanting ions in the outer region of the semiconductor layer and subsequently annealing the outer region of the semiconductor layer to intermix the ions with atoms within the outer region of the semiconductor layer. The semiconductor layer includes an active light emitting layer. A light outcoupling surface of the semiconductor layer has a diameter of less than 10 µm. The outer region of the semiconductor layer extends from an outer surface of the semiconductor layer to a central region of the semiconductor layer that is shaded by a mask during the implanting of the ions.

The semiconductor layer may also include an n-side semiconductor layer adjacent to the light outcoupling surface and a p-side semiconductor layer opposite to the active light emitting layer. The ions may be implanted from a top surface of the p-side semiconductor layer to a depth of approximately 460 nm within the semiconductor layer. Alternatively or in addition, the ions may be implanted from a top surface of the p-side semiconductor layer to a depth within the active light emitting layer.

The ions may include Al ions. A concentration of Al in the outer region of the semiconductor layer may be between 0.3 and 0.5. The ions may have an implantation energy of approximately 400 keV. The ions may be implanted at an angle between 0° and 7° with respect to an axis that is normal to a plane of the mask.

The mask may include a metal, a resist, and/or a hard mask. The metal may have a thickness of less than 1000 nm, the resist may have a thickness of less than 2500 nm, and the hard mask may have a thickness of less than 800 nm. The outer region of the semiconductor layer may have a cross-sectional annular shape.

In some embodiments, a light-emitting diode may include a semiconductor layer having an active light emitting layer. A light outcoupling surface of the semiconductor layer has a diameter of less than 10 µm. A bandgap in an outer region of the semiconductor layer is greater than a bandgap in a central region of the semiconductor layer. The outer region of the semiconductor layer includes ions that are implanted in the outer region of the semiconductor layer and intermixed with atoms within the outer region of the semiconductor layer. The light-emitting diode may be formed by the method discussed above.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures:

FIGS. 13A and 13B show tables of results of ion implantation for the example micro-LED 905 shown in FIG. 9B;

FIGS. 14A-14H show simulations of the mask thicknesses that are needed to achieve different ion implantation depths;

DETAILED DESCRIPTION

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

An artificial reality system, such as a virtual reality (VR), augmented reality (AR), or mixed reality (MR) system, may include a near-eye display (e.g., a headset or a pair of glasses) configured to present content to a user via an electronic or optic display and, in some cases, may also include a console configured to generate content for presentation to the user and to provide the generated content to the near-eye display for presentation. To improve user interaction with presented content, the console may modify or generate content based on a location where the user is looking, which may be determined by tracking the user's eye. Tracking the eye may include tracking the position and/or shape of the pupil of the eye, and/or the rotational position (gaze direction) of the eye. To track the eye, the near-eye display may illuminate a surface of the user's eye using light sources mounted to or within the near-eye display, according to at least one embodiment. An imaging device (e.g., a camera) included in the vicinity of the near-eye display may then capture light reflected by various surfaces of the user's eye. Light that is reflected specularly off the cornea of the user's eye may result in "glints" in the captured image. One way to illuminate the eye to see the pupil as well as the glints is to use a two-dimensional (2D) array of light-emitting diodes (LEDs). Techniques such as a centroiding algorithm may be used to accurately determine the locations of the glints on the eye in the captured image, and the rotational position (e.g., the gaze direction) of the eye may then be determined based on the locations of the glints relative to a known feature of the eye (e.g., the center of the pupil) within the captured image.

Figure 1:
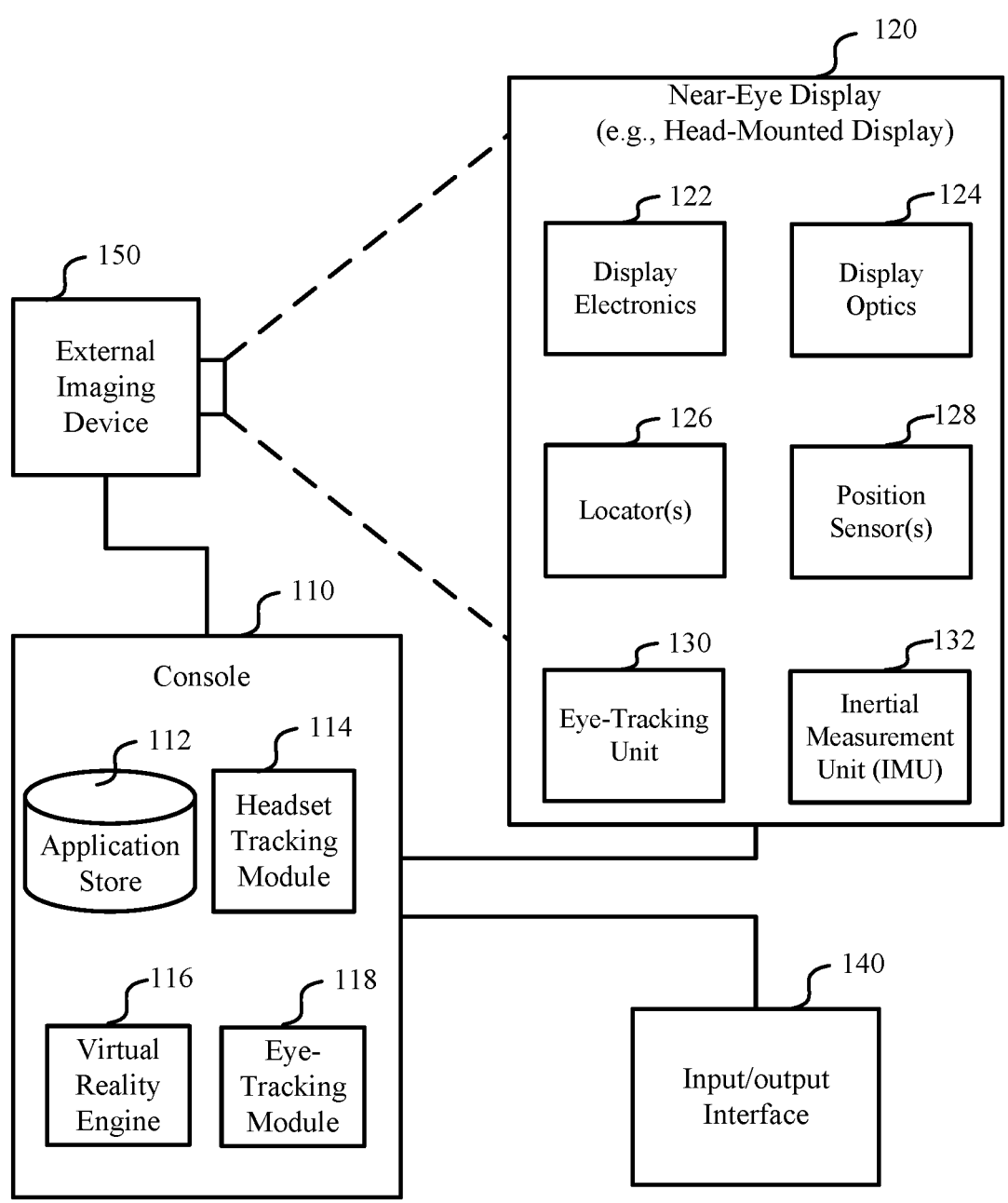
FIG. 1 is a simplified block diagram of an example artificial reality system environment including a near-eye display, according to certain embodiments.

FIG. 1 is a simplified block diagram of an example artificial reality system environment 100 including a near-eye display 120, in accordance with certain embodiments. Artificial reality system environment 100 shown in FIG. 1 may include a near-eye display 120, an external imaging device 150, and an input/output interface 140 that are each coupled to a console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form factor, including a pair of glasses. Additionally, in various embodiments, the functionality described herein may be used in a headset that combines images of an environment external to near-eye display 120 and content received from console 110, or from any other console generating and providing content to a user. Therefore, near-eye display 120, and methods for eye tracking described herein, may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, one or more locators 126, one or more position sensors 128, an eye-tracking unit 130, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display images to the user according to data received from console 110. In various embodiments, display electronics 122 may include one or more display panels, such as a liquid crystal display (LCD), an organic light emitting diode (OLED) display, a micro-LED display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include sub-pixels to emit light of a predominant color such as red, green, blue, white, or yellow. In some implementations, display electronics 122 may display a 3D image through stereo effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers), or magnify image light received from display electronics 122, correct optical errors associated with the image light, and present the corrected image light to a user of near-eye display 120. In various embodiments, display optics 124 may include one or more optical elements. Example optical elements may include a substrate, optical waveguides, an aperture, a Fresnel lens, a convex lens, a concave lens, a filter, or any other suitable optical element that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. In some embodiments, display optics 124 may have an effective focal length larger than the spacing between display optics 124 and display electronics 122 to magnify image light projected by display electronics 122. The amount of magnification of image light by display optics 124 may be adjusted by adding or removing optical elements from display optics 124.

Display optics 124 may be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism. In some embodiments, content provided to display electronics 122 for display may be pre-distorted, and display optics 124 may correct the distortion when it receives image light from display electronics 122 generated based on the pre-distorted content.

Locators 126 may be objects located in specific positions on near-eye display 120 relative to one another and relative to a reference point on near-eye display 120. Console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the near infrared (IR) band (e.g., about 750 nm to 1 mm), in the mid-infrared (IR) band (e.g., about 1 μm to about 20 μm), in the ultraviolet band (e.g., about 10 nm to about 380 nm), in another portion of the electromagnetic spectrum, or in any combination of portions of the electromagnetic spectrum.

In some embodiments, locators 126 may be located beneath an outer surface of near-eye display 120. A portion of near-eye display 120 between a locator 126 and an entity external to near-eye display 120 (e.g., external imaging device 150, a user viewing the outer surface of near-eye display 120) may be transparent to the wavelengths of light emitted or reflected by locators 126 or is thin enough to not substantially attenuate the light emitted or reflected by locators 126. In some embodiments, the outer surface or other portions of near-eye display 120 may be opaque in the visible band, but is transparent in the IR band, and locators 126 may be under the outer surface and may emit light in the IR band.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more imaging devices configured to capture eye tracking data, which an eye-tracking module 118 in console 110 may use to track the user's eye. Eye tracking data may refer to data output by eye-tracking unit 130. Example eye tracking data may include images captured by eye-tracking unit 130 or information derived from the images captured by eye-tracking unit 130. Eye tracking may refer to determining an eye's position, including orientation and location of the eye, relative to near-eye display 120. For example, eye-tracking module 118 may output the eye's pitch and yaw based on images of the eye captured by eye-tracking unit 130. In various embodiments, eye-tracking unit 130 may measure electromagnetic energy reflected by the eye and communicate the measured electromagnetic energy to eye-tracking module 118, which may then determine the eye's position based on the measured electromagnetic energy. For example, eye-tracking unit 130 may measure electromagnetic waves such as visible light, infrared light, radio waves, microwaves, waves in any other part of the electromagnetic spectrum, or a combination thereof reflected by an eye of a user.

Eye-tracking unit 130 may include one or more eye-tracking systems. An eye-tracking system may include an imaging system to image one or more eyes and may optionally include a light emitter, which may generate light that is directed to an eye such that light reflected by the eye may be captured by the imaging system. For example, eye-tracking unit 130 may include a coherent light source (e.g., a VCSEL) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

In some embodiments, eye-tracking unit 130 may include one light emitter and one camera to track each of the user's eyes. In other embodiments, eye-tracking unit 130 may include a plurality of light emitters and one camera to track each of the user's eyes. Eye-tracking unit 130 may also include different eye-tracking systems that operate together to provide improved eye tracking accuracy and responsiveness. For example, eye-tracking unit 130 may include a fast eye-tracking system with a fast response time and a slow eye-tracking system with a slower response time. The fast eye-tracking system may frequently measure an eye to capture data used by eye-tracking module 118 to determine the eye's position relative to a reference eye position. The slow eye-tracking system may independently measure the eye to capture data used by eye-tracking module 118 to determine the reference eye position without reference to a previously determined eye position. Data captured by the slow eye-tracking system may allow eye-tracking module 118 to determine the reference eye position with greater accuracy than the eye's position determined from data captured by the fast eye-tracking system. In various embodiments, the slow eye-tracking system may provide eye-tracking data to eye-tracking module 118 at a lower frequency than the fast eye-tracking system. For example, the slow eye-tracking system may operate less frequently or have a slower response time to conserve power.

Eye-tracking unit 130 may be configured to estimate the orientation of the user's eye. The orientation of the eye may correspond to the direction of the user's gaze within near-eye display 120. The orientation of the user's eye may be defined as the direction of the foveal axis, which is the axis between the fovea (an area on the retina of the eye with the highest concentration of photoreceptors) and the center of the eye's pupil. In general, when a user's eyes are fixed on a point, the foveal axes of the user's eyes intersect that point. The pupillary axis of an eye may be defined as the axis that passes through the center of the pupil and is perpendicular to the corneal surface. In general, even though the pupillary axis and the foveal axis intersect at the center of the pupil, the pupillary axis may not directly align with the foveal axis. For example, the orientation of the foveal axis may be offset from the pupillary axis by approximately $-1°$ to $8°$ laterally and about $\pm 4°$ vertically. Because the foveal axis is defined according to the fovea, which is located in the back of the eye, the foveal axis may be difficult or impossible to measure directly in some eye tracking embodiments. Accordingly, in some embodiments, the orientation of the pupillary axis may be detected and the foveal axis may be estimated based on the detected pupillary axis.

In general, the movement of an eye corresponds not only to an angular rotation of the eye, but also to a translation of the eye, a change in the torsion of the eye, and/or a change in the shape of the eye. Eye-tracking unit 130 may also be configured to detect the translation of the eye, which may be a change in the position of the eye relative to the eye socket. In some embodiments, the translation of the eye may not be detected directly, but may be approximated based on a mapping from a detected angular orientation. Translation of the eye corresponding to a change in the eye's position relative to the eye-tracking unit may also be detected. Translation of this type may occur, for example, due to a shift in the position of near-eye display 120 on a user's head. Eye-tracking unit 130 may also detect the torsion of the eye and the rotation of the eye about the pupillary axis. Eye-tracking unit 130 may use the detected torsion of the eye to estimate the orientation of the foveal axis from the pupillary axis. Eye-tracking unit 130 may also track a change in the shape of the eye, which may be approximated as a skew or scaling linear transform or a twisting distortion (e.g., due to torsional deformation). Eye-tracking unit 130 may estimate the foveal axis based on some combinations of the angular orientation of the pupillary axis, the translation of the eye, the torsion of the eye, and the current shape of the eye.

In some embodiments, eye-tracking unit 130 may include multiple emitters or at least one emitter that can project a structured light pattern on all portions or a portion of the eye. The structured light pattern may be distorted due to the shape of the eye when viewed from an offset angle. Eye-tracking unit 130 may also include at least one camera that may detect the distortions (if any) of the structured light pattern projected onto the eye. The camera may be oriented on a different axis to the eye than the emitter. By detecting the deformation of the structured light pattern on the surface of the eye, eye-tracking unit 130 may determine the shape of the portion of the eye being illuminated by the structured light pattern. Therefore, the captured distorted light pattern may be indicative of the 3D shape of the illuminated portion of the eye. The orientation of the eye may thus be derived from the 3D shape of the illuminated portion of the eye. Eye-tracking unit 130 can also estimate the pupillary axis, the translation of the eye, the torsion of the eye, and the current shape of the eye based on the image of the distorted structured light pattern captured by the camera.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect (or the nearest point between the two axes). The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, a virtual reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to VR engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

VR engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. VR engine 116 may also receive estimated eye position and orientation information from eye-tracking module 118. Based on the received information, VR engine 116 may determine content to provide to near-eye display 120 for presentation to the user. For example, if the received information indicates that the user has looked to the left, VR engine 116 may generate content for near-eye display 120 that mirrors the user's eye movement in a virtual environment. Additionally, VR engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking unit 130 may output eye-tracking data including images of the eye, and eye-tracking module 118 may determine the eye's position based on the images. For example, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, as described above, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light.

Figure 2:
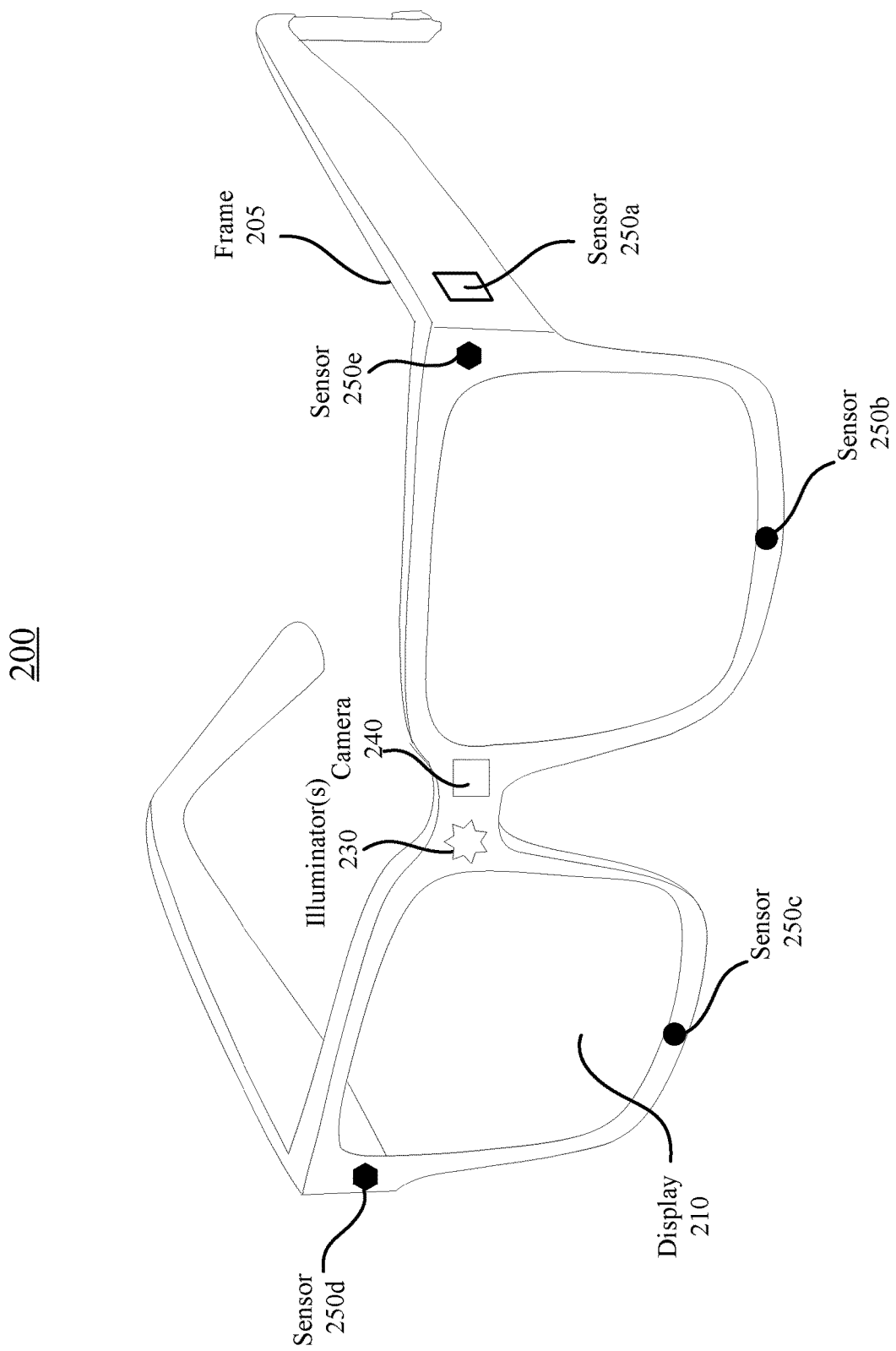
FIG. 2 is a perspective view of a simplified example near-eye display including various sensors.

FIG. 2 is a perspective view of a simplified example near-eye display 200 including various sensors. Near-eye display 200 may be a specific implementation of near-eye display 120 of FIG. 1, and may be configured to operate as a virtual reality display, an augmented reality display, and/or a mixed reality display. Near-eye display 200 may include a frame 205 and a display 210. Display 210 may be configured to present content to a user. In some embodiments, display 210 may include display electronics and/or display optics. For example, as described above with respect to near-eye display 120 of FIG. 1, display 210 may include an LCD display panel, an LED display panel, or an optical display panel (e.g., a waveguide display assembly).

Near-eye display 200 may further include various sensors 250a, 250b, 250c, 250d, and 250e on or within frame 205. In some embodiments, sensors 250a-250e may include one or more depth sensors, motion sensors, position sensors, inertial sensors, or ambient light sensors. In some embodiments, sensors 250a-250e may include one or more image sensors configured to generate image data representing different fields of views in different directions. In some embodiments, sensors 250a-250e may be used as input devices to control or influence the displayed content of near-eye display 200, and/or to provide an interactive VR/AR/MR experience to a user of near-eye display 200. In some embodiments, sensors 250a-250e may also be used for stereoscopic imaging.

In some embodiments, near-eye display 200 may further include one or more illuminators 230 to project light into the physical environment. The projected light may be associated with different frequency bands (e.g., visible light, infra-red light, ultra-violet light, etc.), and may serve various purposes. For example, illuminator(s) 230 may project light in a dark environment (or in an environment with low intensity of infra-red light, ultra-violet light, etc.) to assist sensors 250a-250e in capturing images of different objects within the dark environment. In some embodiments, illuminator(s) 230 may be used to project certain light pattern onto the objects within the environment. In some embodiments, illuminator(s) 230 may be used as locators, such as locators 126 described above with respect to FIG. 1. In some embodiments, illuminator(s) 230 may be a two-dimensional IR array that can illuminate the surrounding environment, such as for hand tracking and/or depth sensing.

In some embodiments, near-eye display 200 may also include a high-resolution camera 240. Camera 240 may capture images of the physical environment in the field of view. The captured images may be processed, for example, by a virtual reality engine (e.g., virtual reality engine 116 of FIG. 1) to add virtual objects to the captured images or modify physical objects in the captured images, and the processed images may be displayed to the user by display 210 for AR or MR applications.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 3:
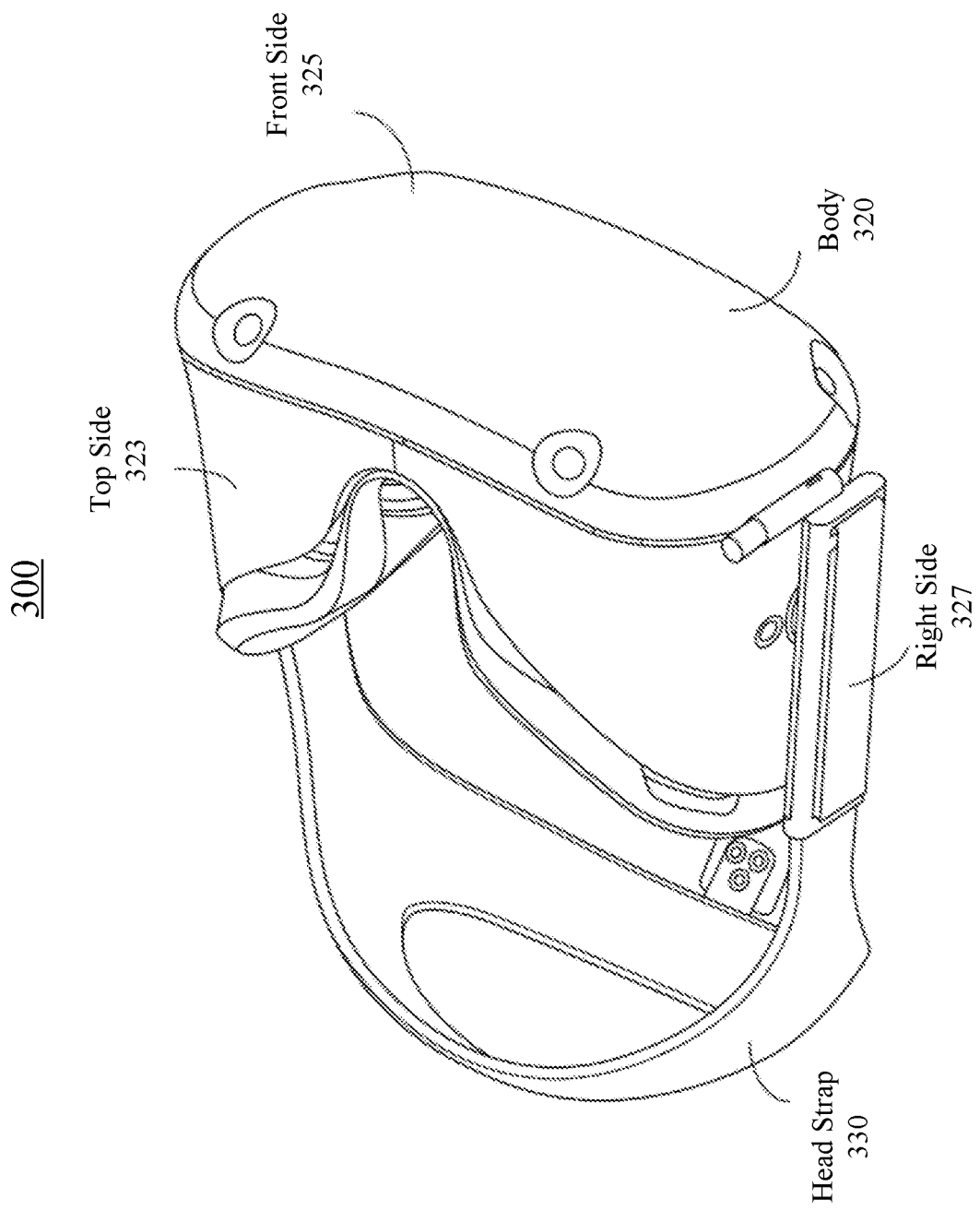
FIG. 3 is a perspective view of an example near-eye display in the form of a head-mounted display (HMD) device for implementing some of the examples disclosed herein.

FIG. 3 is a perspective view of an example near-eye display in the form of a head-mounted display (HMD) device 300 for implementing some of the example near-eye displays (e.g., near-eye display 120) disclosed herein. HMD device 300 may be a part of, e.g., a virtual reality (VR) system, an augmented reality (AR) system, a mixed reality (MR) system, or some combinations thereof. HMD device 300 may include a body 320 and a head strap 330. FIG. 3 shows a top side 323, a front side 325, and a right side 327 of body 320 in the perspective view. Head strap 330 may have an adjustable or extendible length. There may be a sufficient space between body 320 and head strap 330 of HMD device 300 for allowing a user to mount HMD device 300 onto the user's head. In various embodiments, HMD device 300 may include additional, fewer, or different components. For example, in some embodiments, HMD device 300 may include eyeglass temples and temples tips, rather than head strap 330.

HMD device 300 may present to a user media including virtual and/or augmented views of a physical, real-world environment with computer-generated elements. Examples of the media presented by HMD device 300 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 3) enclosed in body 320 of HMD device 300. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro-LED display, an active-matrix organic light emitting diode (AMOLED) display, a transparent organic light emitting diode (TOLED) display, some other display, or some combinations thereof. HMD device 300 may include two eye box regions.

In some implementations, HMD device 300 may include various sensors (not shown), such as depth sensors, motion sensors, position sensors, and eye tracking sensors. Some of these sensors may use a structured light pattern for sensing. In some implementations, HMD device 300 may include an input/output interface for communicating with a console. In some implementations, HMD device 300 may include a virtual reality engine (not shown) that can execute applications within HMD device 300 and receive depth information, position information, acceleration information, velocity information, predicted future positions, or some combination thereof of HMD device 300 from the various sensors. In some implementations, the information received by the virtual reality engine may be used for producing a signal (e.g., display instructions) to the one or more display assemblies. In some implementations, HMD device 300 may include locators (not shown, such as locators 126) located in fixed positions on body 320 relative to one another and relative to a reference point. Each of the locators may emit light that is detectable by an external imaging device.

Figure 4:
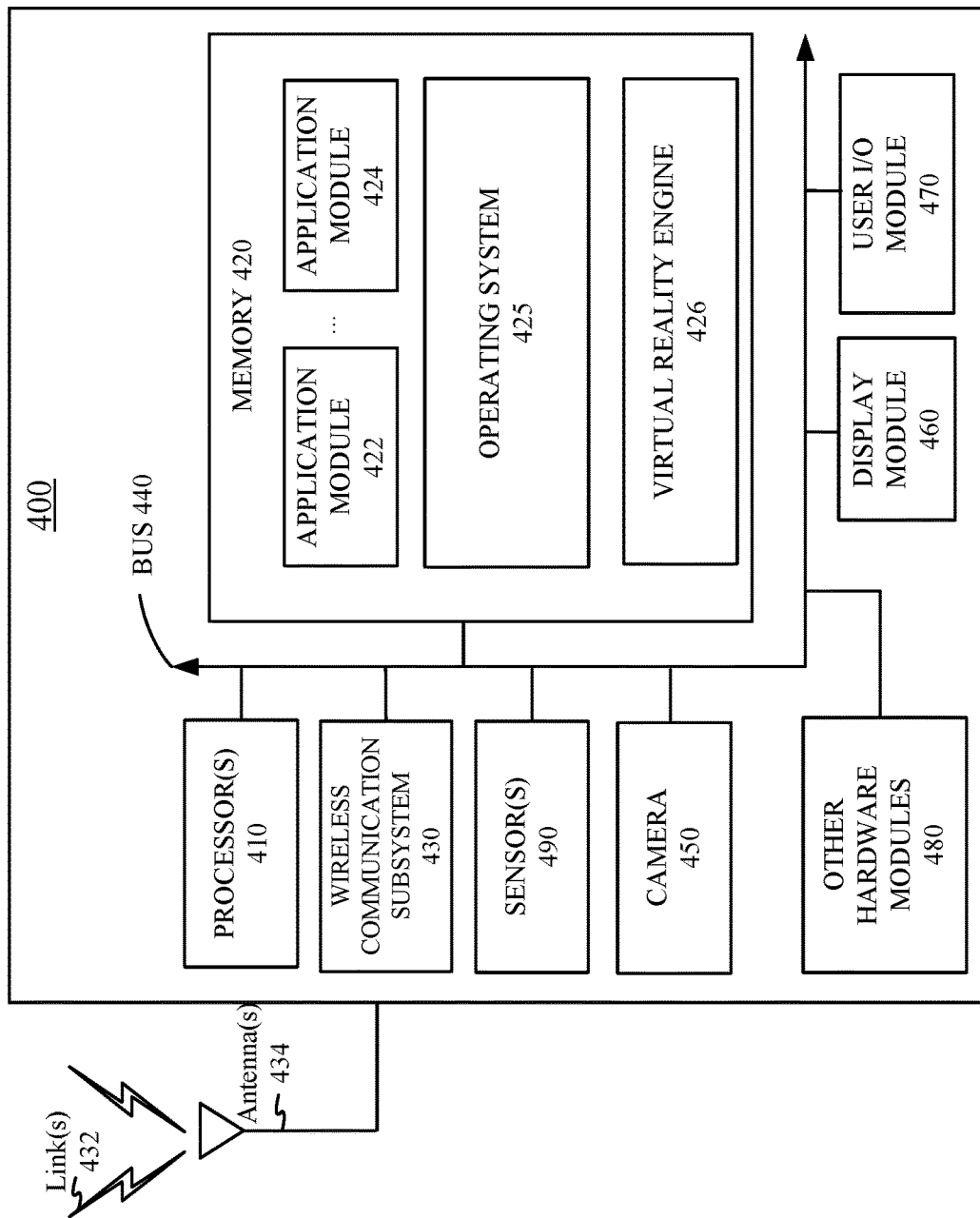
FIG. 4 is a simplified block diagram of an example electronic system of an example near-eye display for implementing some of the examples disclosed herein.

FIG. 4 is a simplified block diagram of an example electronic system 400 of an example near-eye display (e.g., HMD device) for implementing some of the examples disclosed herein. Electronic system 400 may be used as the electronic system of HMD device 1000 or other near-eye displays described above. In this example, electronic system 400 may include one or more processor(s) 410 and a memory 420. Processor(s) 410 may be configured to execute instructions for performing operations at a number of components, and can be, for example, a general-purpose processor or microprocessor suitable for implementation within a portable electronic device. Processor(s) 410 may be communicatively coupled with a plurality of components within electronic system 400. To realize this communicative coupling, processor(s) 410 may communicate with the other illustrated components across a bus 440. Bus 440 may be any subsystem adapted to transfer data within electronic system 400. Bus 440 may include a plurality of computer buses and additional circuitry to transfer data.

Memory 420 may be coupled to processor(s) 410. In some embodiments, memory 420 may offer both short-term and long-term storage and may be divided into several units. Memory 420 may be volatile, such as static random access memory (SRAM) and/or dynamic random access memory (DRAM) and/or non-volatile, such as read-only memory (ROM), flash memory, and the like. Furthermore, memory 420 may include removable storage devices, such as secure digital (SD) cards. Memory 420 may provide storage of computer-readable instructions, data structures, program modules, and other data for electronic system 400. In some embodiments, memory 420 may be distributed into different hardware modules. A set of instructions and/or code might be stored on memory 420. The instructions might take the form of executable code that may be executable by electronic system 400, and/or might take the form of source and/or installable code, which, upon compilation and/or installation on electronic system 400 (e.g., using any of a variety of generally available compilers, installation programs, compression/decompression utilities, etc.), may take the form of executable code.

In some embodiments, memory 420 may store a plurality of application modules 422 through 424, which may include any number of applications. Examples of applications may include gaming applications, conferencing applications, video playback applications, or other suitable applications. The applications may include a depth sensing function or eye tracking function. Application modules 422-424 may include particular instructions to be executed by processor(s) 410. In some embodiments, certain applications or parts of application modules 422-424 may be executable by other hardware modules 480. In certain embodiments, memory 420 may additionally include secure memory, which may include additional security controls to prevent copying or other unauthorized access to secure information.

In some embodiments, memory 420 may include an operating system 425 loaded therein. Operating system 425 may be operable to initiate the execution of the instructions provided by application modules 422-424 and/or manage other hardware modules 480 as well as interfaces with a wireless communication subsystem 430 which may include one or more wireless transceivers. Operating system 425 may be adapted to perform other operations across the components of electronic system 400 including threading, resource management, data storage control and other similar functionality.

Wireless communication subsystem 430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 400 may include one or more antennas 434 for wireless communication as part of wireless communication subsystem 430 or as a separate component coupled to any portion of the system. Depending on desired functionality, wireless communication subsystem 430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 430 may permit data to be exchanged with a network, other computer systems, and/or any other devices described herein. Wireless communication subsystem 430 may include a means for transmitting or receiving data, such as identifiers of HMD devices, position data, a geographic map, a heat map, photos, or videos, using antenna(s) 434 and wireless link(s) 432. Wireless communication subsystem 430, processor(s) 410, and memory 420 may together comprise at least a part of one or more of a means for performing some functions disclosed herein.

Embodiments of electronic system 400 may also include one or more sensors 490. Sensor(s) 490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 490 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 400 may include a display module 460. Display module 460 may be a near-eye display, and may graphically present information, such as images, videos, and various instructions, from electronic system 400 to a user. Such information may be derived from one or more application modules 422-424, virtual reality engine 426, one or more other hardware modules 480, a combination thereof, or any other suitable means for resolving graphical content for the user (e.g., by operating system 425). Display module 460 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 400 may include a user input/output module 470. User input/output module 470 may allow a user to send action requests to electronic system 400. An action request may be a request to perform a particular action. For example, an action request may be to start or end an application or to perform a particular action within the application. User input/output module 470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 400. In some embodiments, user input/output module 470 may provide haptic feedback to the user in accordance with instructions received from electronic system 400. For example, the haptic feedback may be provided when an action request is received or has been performed.

Electronic system 400 may include a camera 450 that may be used to take photos or videos of a user, for example, for tracking the user's eye position. Camera 450 may also be used to take photos or videos of the environment, for example, for VR, AR, or MR applications. Camera 450 may include, for example, a complementary metal-oxide-semiconductor (CMOS) image sensor with a few millions or tens of millions of pixels. In some implementations, camera 450 may include two or more cameras that may be used to capture 3-D images.

In some embodiments, electronic system 400 may include a plurality of other hardware modules 480. Each of other hardware modules 480 may be a physical module within electronic system 400. While each of other hardware modules 480 may be permanently configured as a structure, some of other hardware modules 480 may be temporarily configured to perform specific functions or temporarily activated. Examples of other hardware modules 480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 480 may be implemented in software.

In some embodiments, memory 420 of electronic system 400 may also store a virtual reality engine 426. Virtual reality engine 426 may execute applications within electronic system 400 and receive position information, acceleration information, velocity information, predicted future positions, or some combination thereof of the HMD device from the various sensors. In some embodiments, the information received by virtual reality engine 426 may be used for producing a signal (e.g., display instructions) to display module 460. For example, if the received information indicates that the user has looked to the left, virtual reality engine 426 may generate content for the HMD device that mirrors the user's movement in a virtual environment. Additionally, virtual reality engine 426 may perform an action within an application in response to an action request received from user input/output module 470 and provide feedback to the user. The provided feedback may be visual, audible, or haptic feedback. In some implementations, processor(s) 410 may include one or more GPUs that may execute virtual reality engine 426.

In various implementations, the above-described hardware and modules may be implemented on a single device or on multiple devices that can communicate with one another using wired or wireless connections. For example, in some implementations, some components or modules, such as GPUs, virtual reality engine 426, and applications (e.g., tracking application), may be implemented on a console separate from the head-mounted display device. In some implementations, one console may be connected to or support more than one HMD.

In alternative configurations, different and/or additional components may be included in electronic system 400. Similarly, functionality of one or more of the components can be distributed among the components in a manner different from the manner described above. For example, in some embodiments, electronic system 400 may be modified to include other system environments, such as an AR system environment and/or an MR environment.

As discussed above, LEDs may be used as light sources in various parts of an artificial reality system, such as the display electronics 122, the locators 126, and the eye tracking unit 130. Further, LEDs may be used in various display technologies, such as heads-up displays, television displays, smartphone displays, watch displays, wearable displays, and flexible displays. LEDs can be used in combination with a plurality of sensors in many applications such as the Internet of Things (IOT). The LEDs described herein can be configured to emit light having any desired wavelength, such as ultraviolet, visible, or infrared light. Also, the LEDs described herein can be configured to have any suitable mesa shape, such as planar, vertical, conical, semi-parabolic, parabolic, or combinations thereof. The LEDs described herein may be micro-LEDs that have an active light emitting area with a linear dimension that is less than 50 μm, less than 20 μm, or less than 10 μm. For example, the linear dimension may be as small as 2 μm or 4 μm.

Exemplary embodiments of the invention include methods of reducing surface recombination losses in micro-LEDs. For example, surface recombination may be reduced by passivating the surface of a semiconductor layer of a micro-LED. Alternatively or in addition, surface recombination may be reduced by decreasing lateral carrier mobility. For example, lateral carrier mobility may be decreased by using ion implantation to disrupt the semiconductor lattice outside of a central portion of the micro-LED. Alternatively or in addition, lateral carrier mobility may be decreased by using quantum well intermixing to change the composition of areas of the semiconductor layer outside of the central portion of the micro-LED.

Figure 5A:
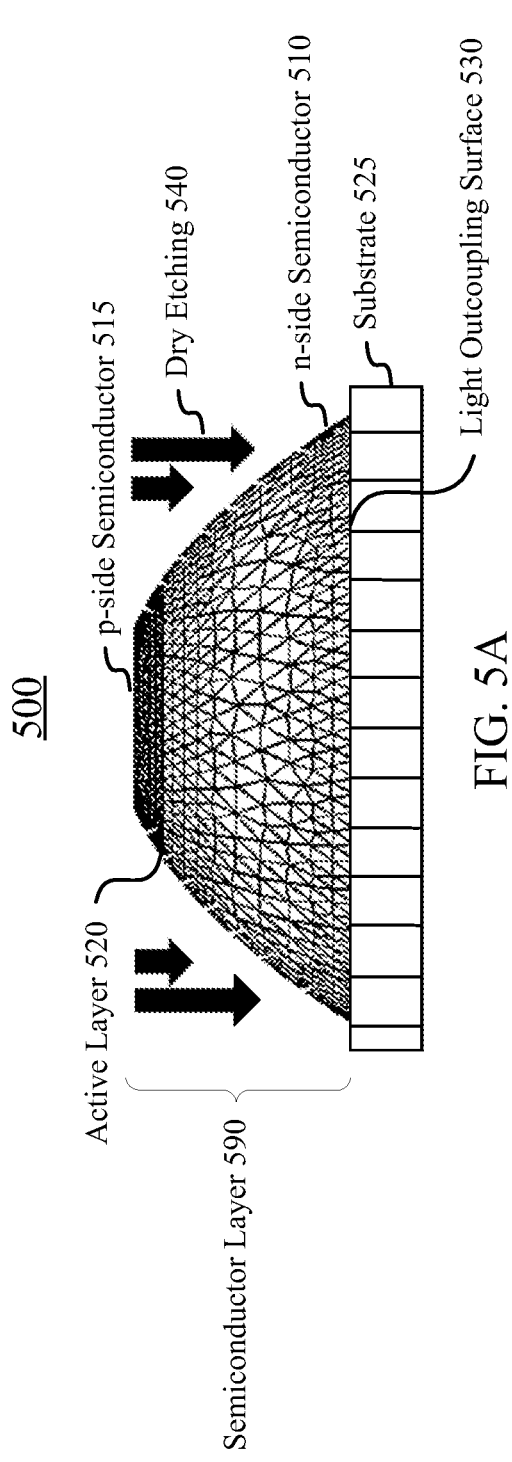
FIGS. 5A, 5B, 6A, and 6B illustrate a method of reducing surface recombination by passivating the surface of a semiconductor layer of a micro-LED.

FIGS. 5A, 5B, 6A, and 6B illustrate a method of reducing surface recombination by passivating the surface of a semiconductor layer of a micro-LED. FIG. 5A shows a micro-LED 500 that undergoes dry etching 540. The micro-LED 500 includes an n-side semiconductor layer 510, a p-side semiconductor layer 515, and an active light emitting layer 520. Together the n-side semiconductor layer 510, the p-side semiconductor layer 515, and the active light emitting layer 520 form a semiconductor layer 590. The semiconductor layer 590 may include any suitable material, such as a group III phosphide or a group III arsenide. The semiconductor layer 590 may have a mesa shape, and the mesa shape may be planar, vertical, conical, semi-parabolic, and/or parabolic. The n-side semiconductor layer 510 may be formed on a substrate 525, and may have a light outcoupling surface 530. In the example shown in FIG. 5A, the semiconductor layer 590 has a parabolic mesa shape, and the diameter of the light outcoupling surface 530 is less than 10 μm.

As shown in FIG. 5A, the surface of the semiconductor layer 590 of the micro-LED 500 is damaged by the dry etching 540. The dry etching 540 causes surface defects, such as dangling bonds, that increase the number of electronic states that capture electrons, causing the electrons to recombine and be lost at the surface. As discussed above, this problem is especially severe for micro-LEDs, because their small size causes the vast majority of electrons to diffuse to the surface of the semiconductor layer 590, where they are lost. This problem is most pronounced in red micro-LEDs, because the diffusion length in the group III phosphide materials that are typically used in red micro-LEDs is on the order of microns. In contrast, the diffusion length in the group III nitride materials that are typically used in green and blue micro-LEDs is on the order of hundreds of nanometers.

Figure 5B:
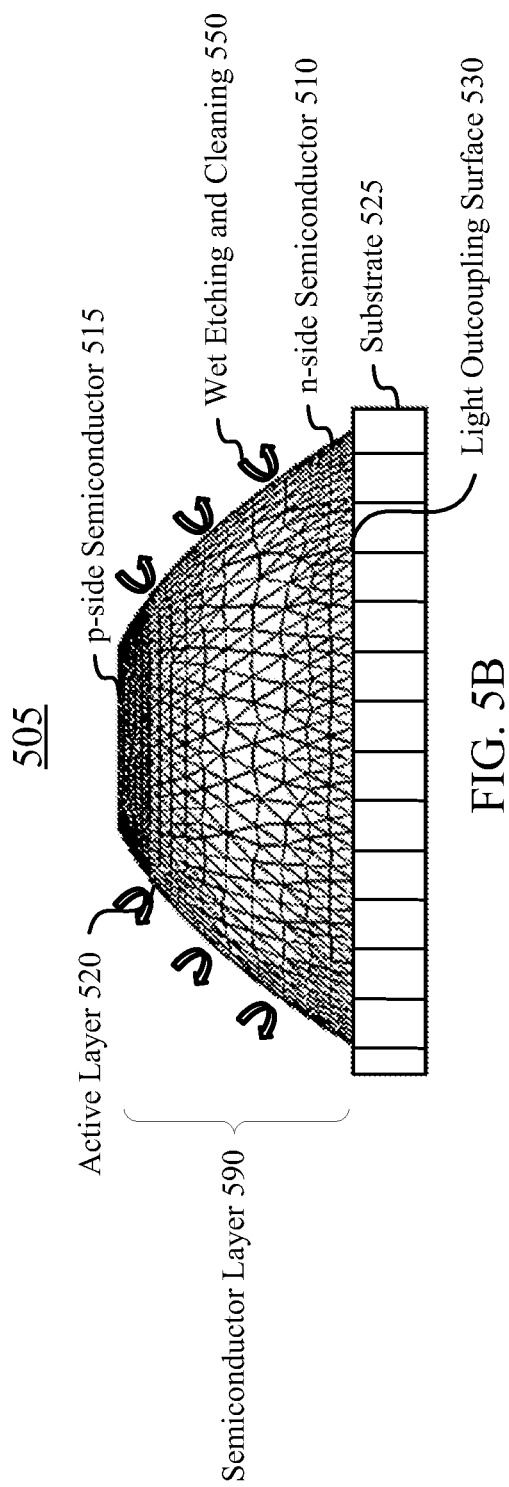

As shown in FIG. 5B, wet etching and/or cleaning 550 may be applied to the surface of the semiconductor layer 590 to form micro-LED 505. The wet etching and/or cleaning 550 may remove an oxide layer and/or residual atoms that are left after the dry etching 540. Various materials may be used, such as an acid or a base. For example, hydrochloric acid, ammonium hydroxide, and/or a piranha solution may be used.

Figures 6A, 6B:
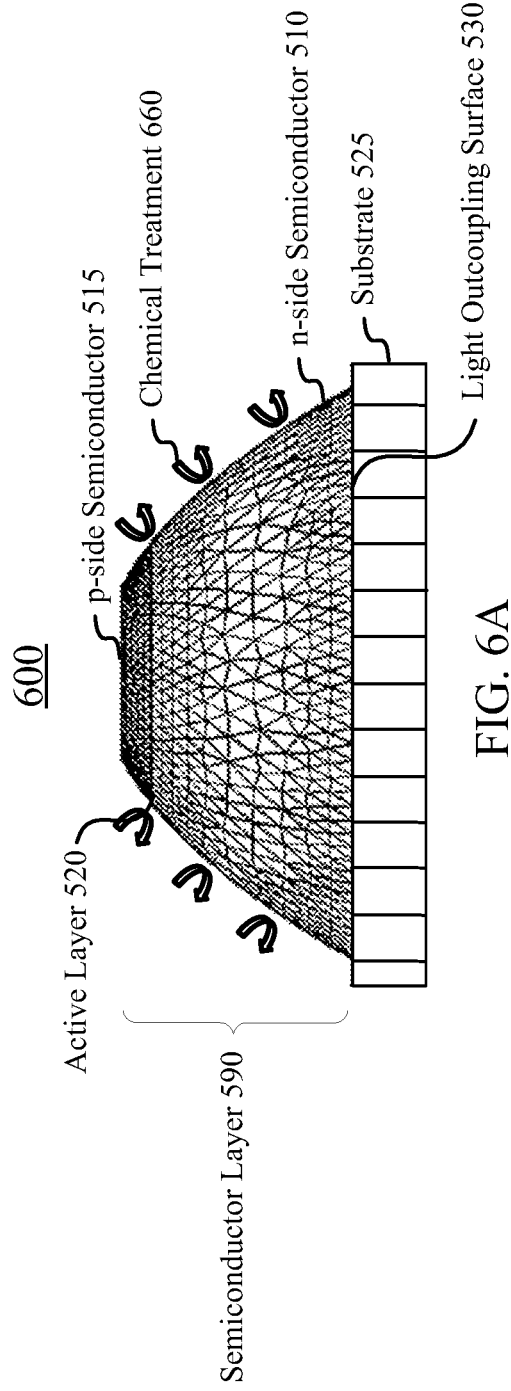

As shown in FIG. 6A, a chemical treatment 660 may be performed to remove remaining materials from the surface of the semiconductor layer 590 to form micro-LED 600, and smooth out the surface of the semiconductor layer 590. For example, the chemical treatment 660 may apply ammonium sulfide to the surface of the semiconductor layer 590 under ambient conditions, or may use molecular beam epitaxy (MBE) to apply ZnSe in vacuum or in an atmosphere having a pressure less than 10 mbar. The chemical may be applied by any suitable method, such as MBE, metal organic chemical vapor deposition (MOCVD), or metal organic vapor phase epitaxy (MOVPE).

As shown in FIG. 6B, a passivation layer 670 may subsequently be deposited on the surface of the semiconductor layer 590 to form micro-LED 605. The dielectric material may be deposited by various techniques, such as atomic layer deposition (ALD), inductively coupled plasma (ICP), plasma-enhanced chemical vapor deposition (PECVD), or inductively coupled plasma chemical vapor deposition (ICP CVD). The dielectric material may be deposited in vacuum or in an atmosphere having a pressure less than 10 mbar. Alternatively, the dielectric material may be deposited by sputtering or evaporation. The dielectric material may include oxides and/or nitrides. For example, the dielectric material may include $SiN_x$, $SiO_x$, $HfO_x$, $AlN_x$, and/or $AlO_x$. As more specific examples, the dielectric material may include $SiN$, $SiO_2$, $HfO_2$, $AlN$, and/or $Al_2O_3$. The dielectric material may be crystalline or amorphous.

The passivation layer 670 may terminate open chemical bonds on the surface of the semiconductor layer 590, thereby reducing the density of interface states, which may be recombination active. The passivation layer 670 may also act as a protective layer and/or enhance the reflective properties of the micro-LED 605. The passivation layer 670 may reduce the surface recombination of the micro-LED 605. For example, the surface recombination velocity (SRV) may be reduced to less than 10,000 cm/sec. Furthermore, the passivation layer 670 may modify the surface of the semiconductor layer 590 by inducing a charge, bending the band structure, and/or creating an inversion layer, e.g. by internal charge or polarization, so that minority carriers are repelled from the interface and prevented from recombining.

The passivation layer 670 may be formed on the entire outer surface of the semiconductor layer 590, including the outer surface of the active light emitting layer 520. A gap may be left in the passivation layer 670 at the top of the semiconductor layer 590 for a p-contact to be formed. Forming the passivation layer 670 on the outer surface of the active light emitting layer 520 is advantageous for reducing the surface recombination, because the active light emitting layer 520 is where the electrons and holes combine to emit radiation.

The light outcoupling surface 530 of the semiconductor layer 590 may have a diameter that is less than twice the electron diffusion length of the material of the semiconductor layer 590. The electron diffusion length L may be defined as $L=\sqrt{D*\tau}$, where D is the diffusivity of the material of the semiconductor layer 590, and τ is the lifetime of an electron within the semiconductor layer 590. The electron diffusion length L is typically between 3 and 5 μm for group III phosphides and approximately 100 nm for group III nitrides. The techniques described herein may advantageously be applied when the diameter of the light outcoupling surface 530 of the semiconductor layer 590 is less than twice the electron diffusion length L of the material of the semiconductor layer 590, because this is when a significant number of electrons are lost at the surface of the semiconductor layer 590. The electron diffusion length L may vary based on whether it is measured in the p-side semiconductor layer 515, the n-side semiconductor layer 510, or the active layer 520. The electron diffusion length L may also vary based on the crystallographic structure of the semiconductor layer 590.

Figure 7:
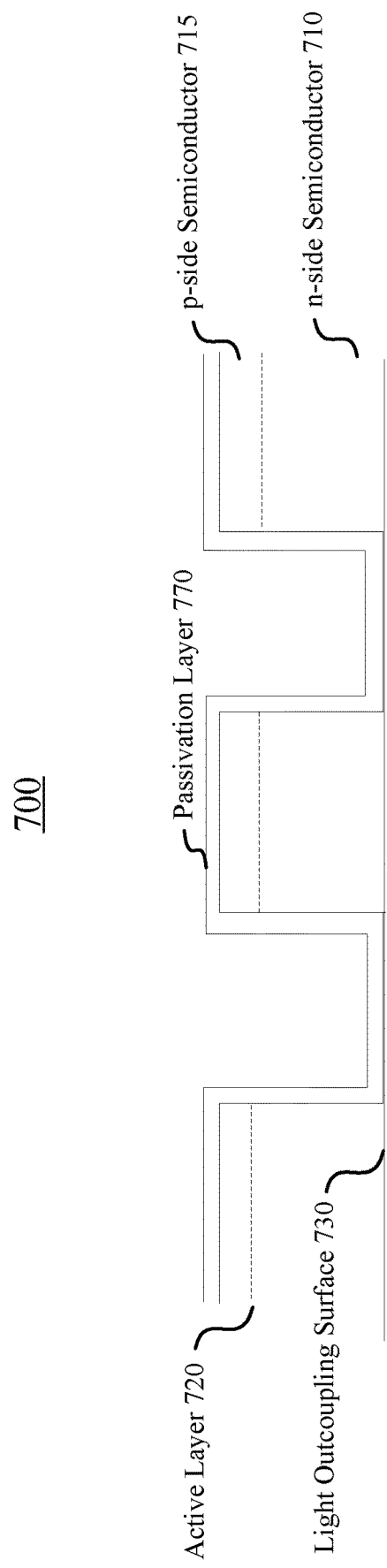
FIG. 7 shows an array of micro-LEDs that have been passivated according to some of the examples disclosed herein.

FIG. 7 shows an array of micro-LEDs 700 that have been passivated according to the methods described above. The array of micro-LEDs 700 includes a semiconductor layer having an active light emitting layer 720 that is arranged between a p-side semiconductor layer 715 and an n-side semiconductor layer 710. The n-side semiconductor layer 710 includes a light outcoupling surface 730 having a diameter that is less than twice the electron diffusion length L of the material of the semiconductor layer for each mesa. A passivation layer 770 is formed on the surface of the semiconductor layer, and covers the active light emitting layer 720. The methods described above are advantageous for micro-LED structures in which the active light emitting layer 720 is exposed to the outside, such that the passivation layer 770 covers the exposed portion of the active light emitting layer 720.

Figure 8:
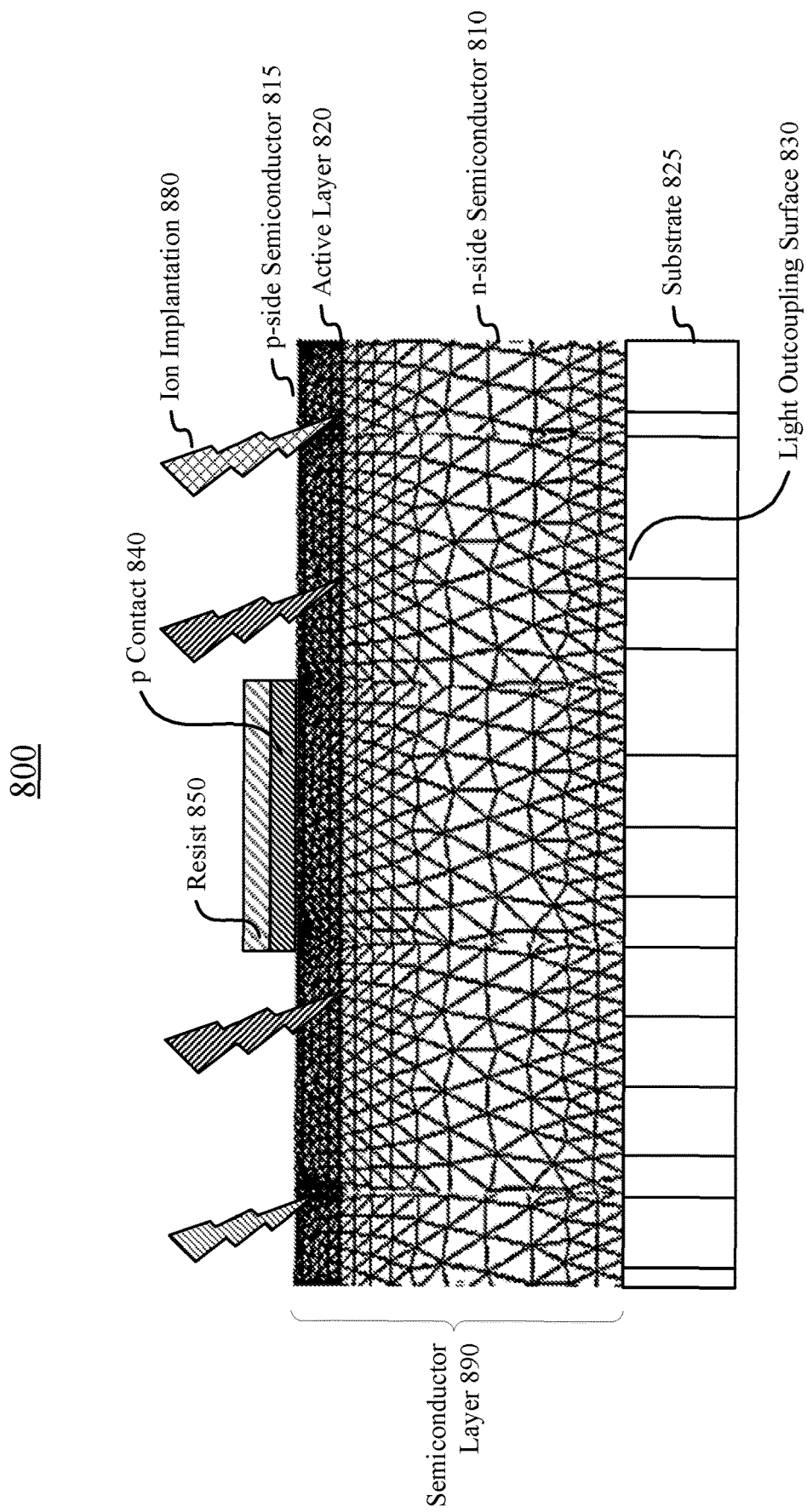
FIG. 8 illustrates a method of reducing lateral carrier mobility and surface recombination by using ion implantation to disrupt the semiconductor lattice outside of a central portion of the micro-LED.

FIG. 8 illustrates a method of reducing lateral carrier mobility and surface recombination by using ion implantation to disrupt the semiconductor lattice outside of a central portion of the micro-LED. The ion implantation reduces the number of electrons that reach the outer surface of the micro-LED, and therefore reduces the amount of surface recombination. Bombarding the semiconductor material with high-energy ions has two effects. First, the lattice of the semiconductor material becomes less electrically conductive, so the current does not spread through the entire structure in all directions, and instead is funneled vertically through the central region. Second, the diffusivity is reduced in the bombarded region, such that the electrons do not move as far laterally. Both the diffusivity D and the electron diffusion length L are reduced by the ion implantation.

FIG. 8 shows a micro-LED 500 that undergoes ion implantation 880 before a mesa structure is formed from the semiconductor layer. As shown in FIG. 8, the micro-LED 800 includes an n-side semiconductor layer 810, a p-side semiconductor layer 815, and an active light emitting layer 820. Together the n-side semiconductor layer 810, the p-side semiconductor layer 815, and the active light emitting layer 820 form a semiconductor layer 890. The semiconductor layer 890 may include any suitable material, such as a group III phosphide or a group III arsenide. The n-side semiconductor layer 810 may be formed on a substrate 825, and may have a light outcoupling surface 830. The diameter of the light outcoupling surface 530 may be less than 10 μm. A p contact 840 may be formed on a top surface of the p-side semiconductor layer 815, and a resist 850 may be formed on a top surface of the p contact 840. The p contact 840 may be made of a metal, such as titanium or gold.

The p contact and the resist 850 may be used as a mask to define an outer region of the semiconductor layer 890 where the ions are implanted. The outer region will include the portions of the semiconductor layer that are not shaded by the mask during ion implantation. If the ions are incident at an angle of 0° with respect to an axis that is normal to a plane of the mask (i.e. the plane of the mask is along the horizontal direction in FIG. 8), the outer region will include the portions of the semiconductor layer 890 that are not directly beneath the mask. On the other hand, if the ions are incident at an angle that is greater than 0° with respect to the axis that is normal to a plane of the mask, the outer region will include the portions of the semiconductor layer that are not shaded by the mask, thereby forming an outer region having interior edges that are sloped at the angle of implantation. For example, the ions may be implanted at an angle between 0° and 7° with respect to the axis that is normal to the plane of the mask.

As shown in FIG. 8, ion implantation 880 may be performed before the semiconductor layer 890 is formed into a mesa shape. The mesa shape may be planar, vertical, conical, semi-parabolic, and/or parabolic. Alternatively, ion implantation may be performed after the semiconductor layer 890 is formed into the mesa shape. In this example, the energy of the ions would be reduced.

Various ions may be used, such as H or He ions. The implantation pattern may be controlled by adjusting the implantation angle, the ion energy, the types of ions, and/or the masking of the implantation region. For example, the depth to which the ions are implanted may be varied by changing the energy of the ions. H and He ions may be implanted with an energy between 20 keV and 140 keV. For example, for red micro-LEDs, a 20 keV implantation energy may result in an implantation depth of 200 nm, an 80 keV implantation energy may result in an implantation depth of 600 nm, and a 140 keV implantation energy may result in an implantation depth of 1000 nm. The implantation energy for thinner p-side micro-LEDs, such as blue and green GaN-based micro-LEDs, may range from 5 keV to 120 keV. On the other hand, the implantation energy for thicker p-side micro-LEDs, such as infrared (IR) micro-LEDs, may range from 80 keV to 400 keV. The implantation dose of the ions may be between $1\times10^{14}$ cm$^{-2}$ and $1\times10^{16}$ cm$^{-2}$. The lateral carrier diffusion in the outer region of the semiconductor layer 890 may be reduced to less than 1 cm$^2$/s by performing ion implantation.

Figure 9:
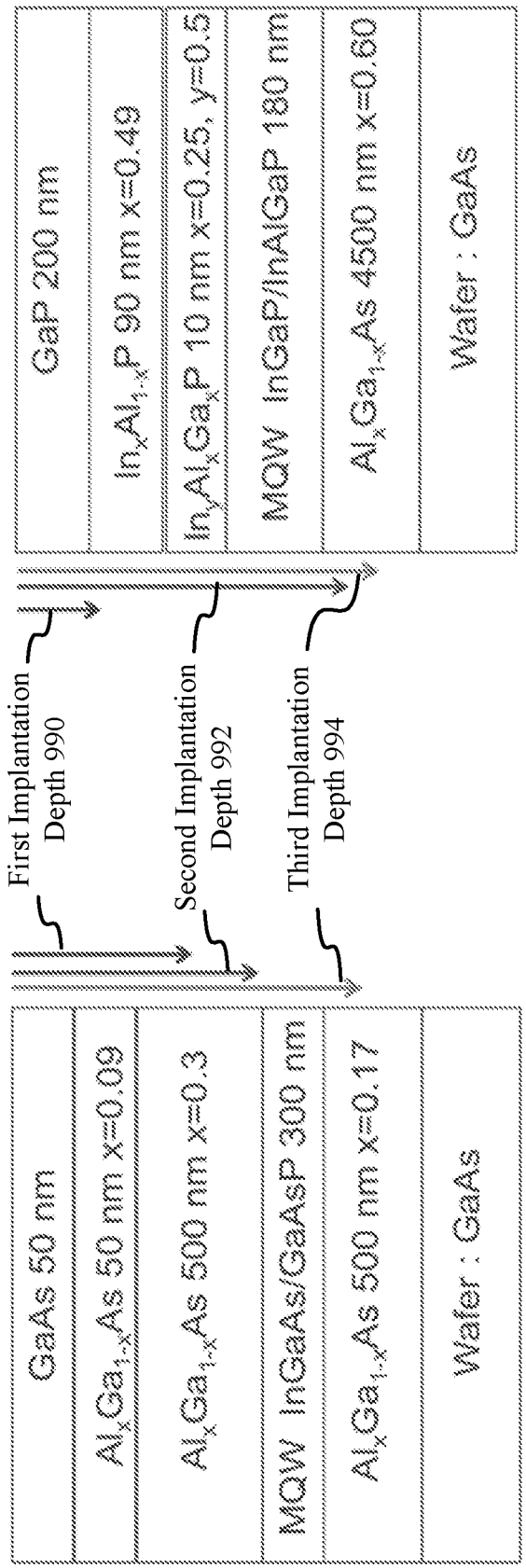
FIGS. 9A and 9B show various ion implantation depths for different micro-LEDs.
Figure 10:
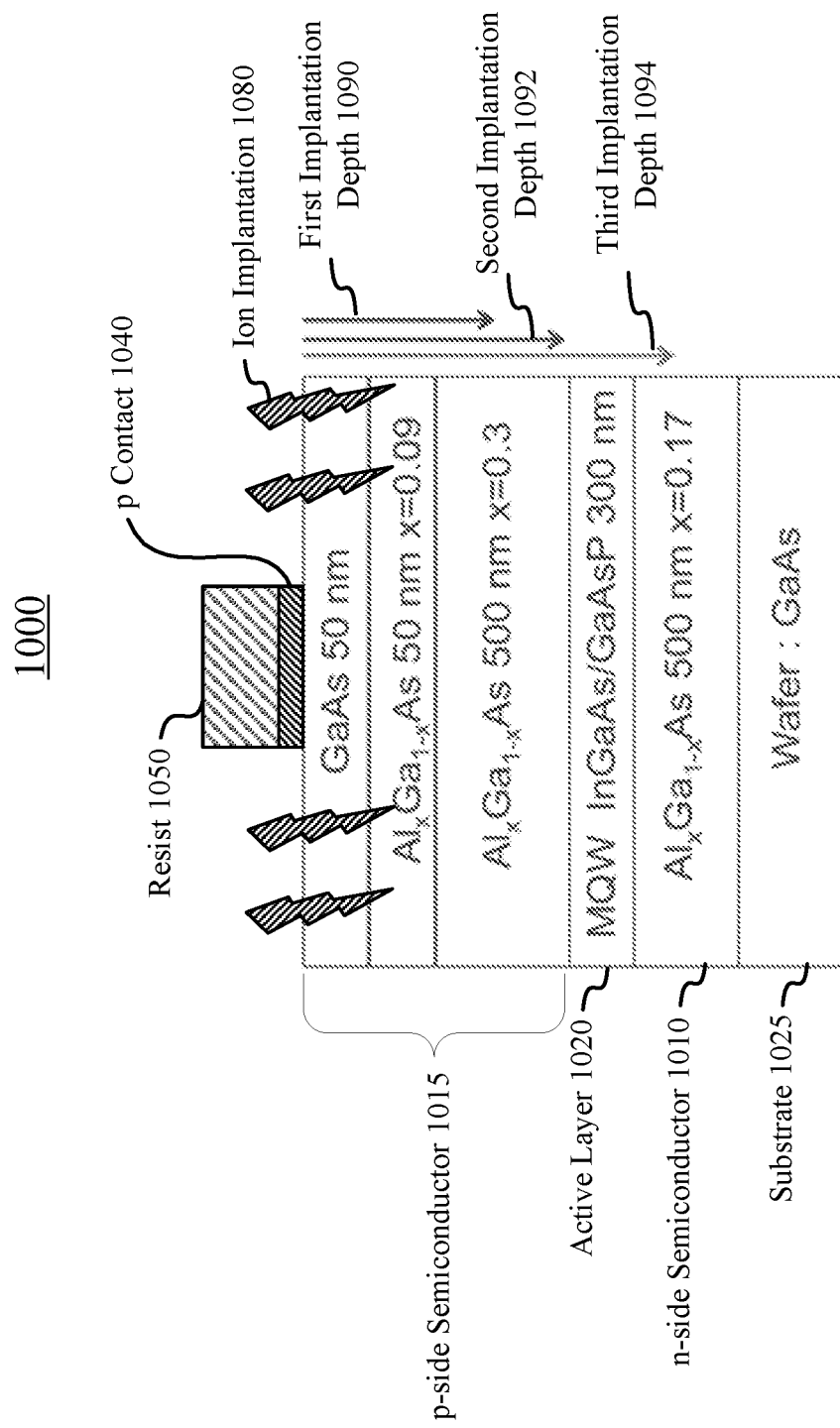
FIG. 10 shows additional details of the example micro-LED shown in FIG. 9A.

FIGS. 9A and 9B show various ion implantation depths for micro-LEDs. FIG. 10 shows additional details of the micro-LED shown in FIG. 9A. FIG. 9A shows an infrared micro-LED 900 that emits light at 940 nm, and FIG. 9B shows a red micro-LED 905 that emits light at 630 nm. In the examples shown in FIGS. 9A and 9B, the first implantation depth 990 is 200 nm, the second implantation depth 992 is 600 nm, and the third implantation depth 994 is 1000 nm.

As shown in FIGS. 9A and 10, the semiconductor layer of the micro-LED 900 includes a p-side semiconductor layer 915 that has a 50 nm thick GaAs layer, a 50 nm thick $Al_{0.09}Ga_{0.91}As$ layer, and a 500 nm thick $Al_{0.3}Ga_{0.7}As$ layer. The semiconductor layer of the micro-LED 900 also includes a 300 nm thick InGaAs/GaAsP multiple quantum well (MQW) layer 920 that is an active light emitting layer, and an n-side semiconductor layer 910 that has a 500 nm thick $Al_{0.17}Ga_{0.83}As$ layer. The semiconductor layer is formed on a GaAs substrate 925. The first implantation depth 990 extends from the top of the p-side semiconductor layer 915 through a depth within the 500 nm thick $Al_{0.3}Ga_{0.7}As$ layer. The second implantation depth 992 extends from the top of the p-side semiconductor layer 915 through the interface between the p-side semiconductor layer 915 and the active light emitting layer 920. The third implantation depth 994 extends from the top of the p-side semiconductor layer 915 through a depth within the n-side semiconductor layer 910. The micro-LED 900 includes a p contact 940 and a resist 950 that are used as a mask during ion implantation 980.

As shown in FIG. 9B, the semiconductor layer of the micro-LED 905 includes a p-side semiconductor layer that has a 200 nm thick GaP layer, a 90 nm thick $In_{0.49}Al_{0.51}P$ layer, and a 10 nm thick $In_{0.5}Al_{0.25}Ga_{0.25}P$ layer. The semiconductor layer of the micro-LED 905 also includes a 180 nm thick InGaP/InAlGaP MQW layer that is an active light emitting layer, and an n-side semiconductor layer that has a 4500 nm thick $Al_{0.6}Ga_{0.4}As$ layer. The semiconductor layer is formed on a GaAs substrate. The first implantation depth 990 extends from the top of the p-side semiconductor layer to the interface between the p-side semiconductor layer and the active light emitting layer. The second implantation depth 992 and the third implantation depth 994 extend from the top of the p-side semiconductor layer through different depths within the n-side semiconductor layer.

As shown in FIGS. 9A and 9B, the ions may be implanted to various depths within the micro-LED. For example, the ions may be implanted from a top surface of the p-side semiconductor layer to a depth within the p-side semiconductor layer. Alternatively, the ions may be implanted from a top surface of the p-side semiconductor layer to a depth within the active light emitting layer. As another option, the ions may be implanted from a top surface of the p-side semiconductor layer to a depth within the n-side semiconductor layer.

Figure 11A:
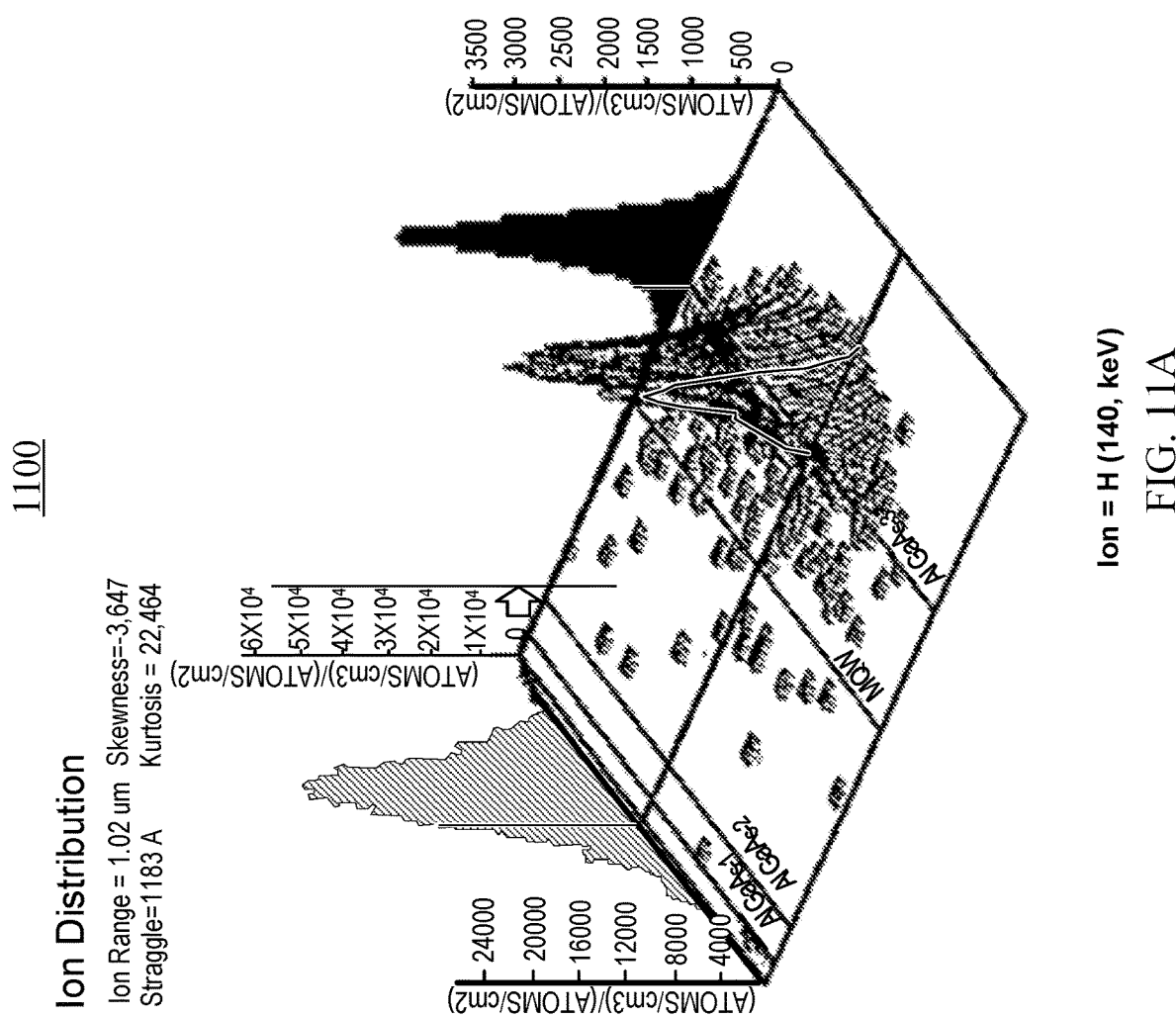
FIGS. 11A and 11B show simulations of various ion distributions for the example micro-LED shown in FIG. 9B.
Figure 11B:
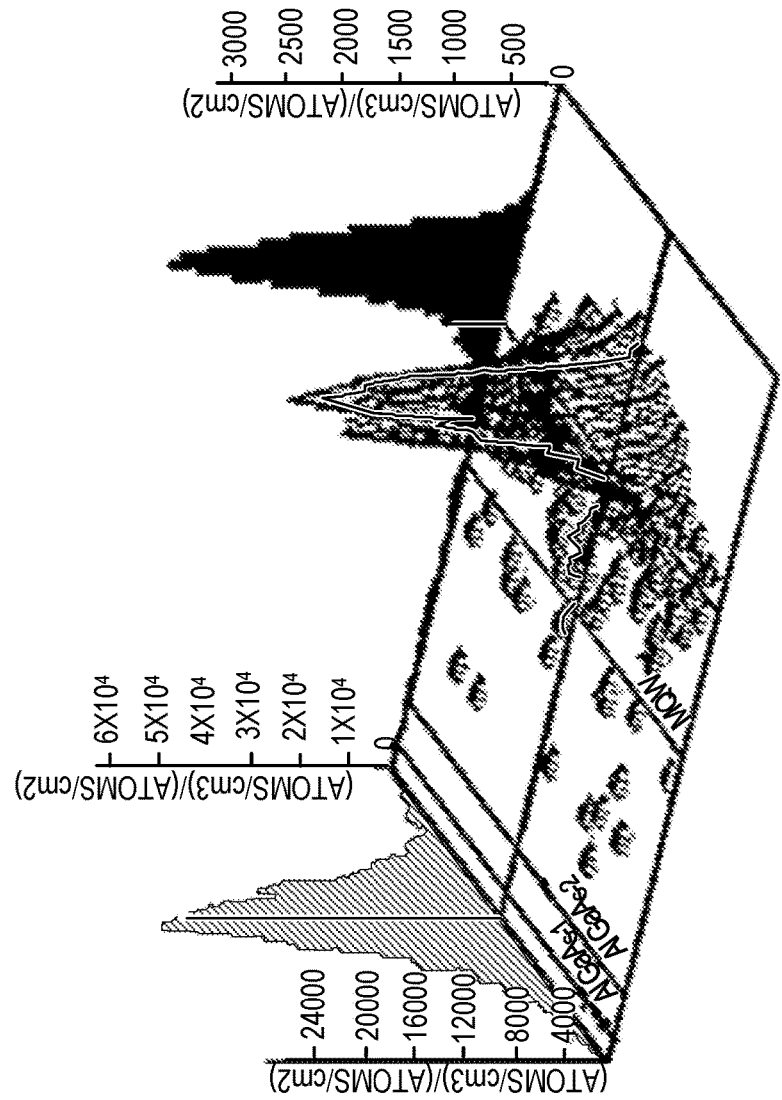

FIGS. 11A and 11B show simulations of various ion distributions for the example micro-LED 905 shown in FIG. 9B. FIG. 11A shows an ion distribution 1100 for hydrogen ions that were implanted with an energy of 140 keV and at an angle of 7° with respect to the axis that is normal to the plane of the mask, and FIG. 11B shows an ion distribution 1105 for hydrogen ions that were implanted with an energy of 140 keV and at an angle of 0° with respect to the axis that is normal to the plane of the mask. FIG. 11A shows that the 7° implantation angle results in a displacement of 120 nm.

Figure 12A:
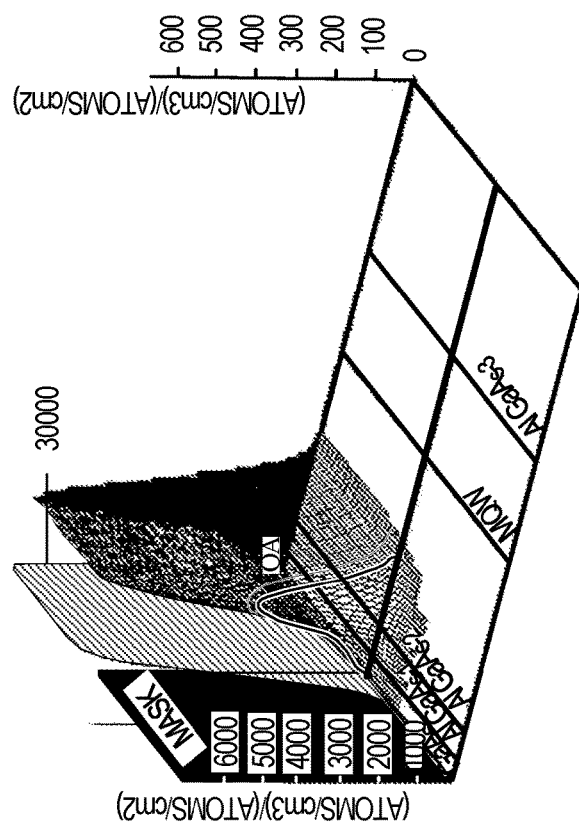
FIGS. 12A-12C show simulations of additional ion distributions for the example micro-LED shown in FIG. 9B.
Figure 12B:
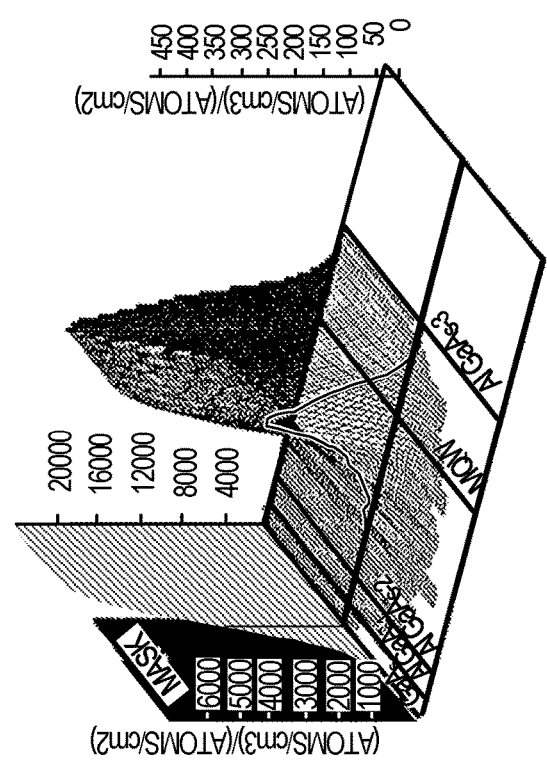
Figure 12C:
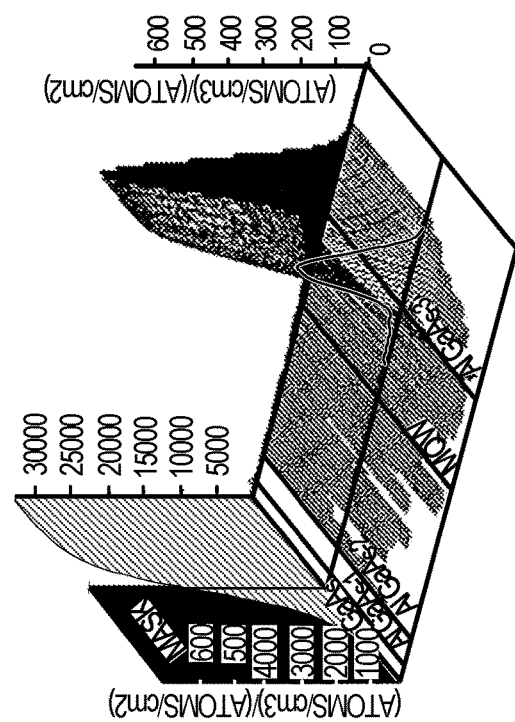

FIGS. 12A-12C show simulations of additional ion distributions for the example micro-LED 905 shown in FIG. 9B. FIG. 12A shows an ion distribution 1200 for hydrogen ions that were implanted with an energy of 20 keV and at an angle of 0° with respect to the axis that is normal to the plane of the mask, FIG. 12B shows an ion distribution 1205 for hydrogen ions that were implanted with an energy of 80 keV and at an angle of 0° with respect to the axis that is normal to the plane of the mask, and FIG. 12C shows an ion distribution 1210 for hydrogen ions that were implanted with an energy of 140 keV and at an angle of 0° with respect to the axis that is normal to the plane of the mask. FIGS. 12A-12C show that there is only a small increase in the ion distribution from 60 nm to 108 nm as the implantation energy and the implantation depth increase.

FIGS. 13A and 13B show tables of results of ion implantation for the example micro-LED 905 shown in FIG. 9B. The tables indicate examples of various parameters for three ion implantation depths (200 nm, 600 nm, and 1000 nm). The parameters include the ion implantation energy (Energy H or Energy E), the projected range (Rp), the depths straggle, the radial, and the radial straggle. The ion implantation energy is the energy at which ions are accelerated toward the sample, in units of keV. The projected range (Rp) is the depth to which the maximum number of ions travel in the sample (or in other words, the highest concentration of ions is at the projected range), in units of nm. This is in the same direction as the direction of implantation. The depths straggle, which may also be referred to as the projected straggle, is a measure of the distribution of the ions and is one standard deviation of that distribution. This is in the same direction as the projected range (Rp). The radial is a measure of the spread of ions in a direction perpendicular to the implantation direction. The radial straggle, which may also be referred to as the lateral straggle, is the standard deviation of the radial distribution, and is in the same direction as the radial distribution.

FIG. 13A shows a table 1300 of results of ion implantation for hydrogen ions, and FIG. 13B shows a table 1305 of results of ion implantation for helium ions. As shown in FIGS. 13A and 13B, there is only a small increase in the vertical ion distribution from 60 nm to 160 nm as the implantation energy and the implantation depth increase. However, there is a stronger increase in the lateral ion distribution from 140 nm to 600 nm as the implantation energy and the implantation depth increase.

The parameters shown in FIG. 13A are merely examples, and can have other values. For example, the ion implantation energy for an ion implantation depth of 200 nm can range from 15 keV to 25 keV, the ion implantation energy for an ion implantation depth of 600 nm can range from 60 keV to 100 keV, and the ion implantation energy for an ion implantation depth of 1000 nm can range from 105 keV to 175 keV. Further, the projected range (Rp) for an ion implantation depth of 200 nm can range from 147 nm to 245 nm, the projected range (Rp) for an ion implantation depth of 600 nm can range from 454 nm to 756 nm, and the projected range (Rp) for an ion implantation depth of 1000 nm can range from 795 nm to 1,325 nm. In addition, the depths straggle for an ion implantation depth of 200 nm can range from 48 nm to 80 nm, the depths straggle for an ion implantation depth of 600 nm can range from 84 nm to 140 nm, and the depths straggle for an ion implantation depth of 1000 nm can range from 100 nm to 167 nm. Also, the radial for an ion implantation depth of 200 nm can range from 105 nm to 175 nm, the radial for an ion implantation depth of 600 nm can range from 225 nm to 437 nm, and the radial for an ion implantation depth of 1000 nm can range from 450 nm to 750 nm. Further, the radial straggle for an ion implantation depth of 200 nm can range from 45 nm to 75 nm, the radial straggle for an ion implantation depth of 600 nm can range from 113 nm to 187 nm, and the radial straggle for an ion implantation depth of 1000 nm can range from 300 nm to 500 nm.

Similarly, the parameters shown in FIG. 13B are merely examples, and can have other values. For example, the ion implantation energy for an ion implantation depth of 200 nm can range from 22 keV to 37 keV, the ion implantation energy for an ion implantation depth of 600 nm can range from 90 keV to 150 keV, and the ion implantation energy for an ion implantation depth of 1000 nm can range from 225 keV to 375 keV. Further, the projected range (Rp) for an ion implantation depth of 200 nm can range from 148 nm to 247 nm, the projected range (Rp) for an ion implantation depth of 600 nm can range from 438 nm to 731 nm, and the projected range (Rp) for an ion implantation depth of 1000 nm can range from 780 nm to 1,300 nm. In addition, the depths straggle for an ion implantation depth of 200 nm can range from 61 nm to 101 nm, the depths straggle for an ion implantation depth of 600 nm can range from 105 nm to 175 nm, and the depths straggle for an ion implantation depth of 1000 nm can range from 124 nm to 206 nm. Also, the radial for an ion implantation depth of 200 nm can range from 120 nm to 200 nm, the radial for an ion implantation depth of 600 nm can range from 262 nm to 437 nm, and the radial for an ion implantation depth of 1000 nm can range from 375 nm to 625 nm. Further, the radial straggle for an ion implantation depth of 200 nm can range from 45 nm to 75 nm, the radial straggle for an ion implantation depth of 600 nm can range from 90 nm to 150 nm, and the radial straggle for an ion implantation depth of 1000 nm can range from 187 nm to 312 nm.

FIGS. 14A-14H show simulations of the mask thicknesses that are needed to achieve different ion implantation depths. FIG. 14A shows a graph 1400 of the mask thickness as a function of the implantation energy of hydrogen ions for an Al mask, FIG. 14B shows a graph 1405 of the mask thickness as a function of the implantation energy of hydrogen ions for an AZ111 photoresist mask, FIG. 14C shows a graph 1410 of the mask thickness as a function of the implantation energy of hydrogen ions for an $Si_3N_4$ mask, FIG. 14D shows a graph 1415 of the mask thickness as a function of the implantation energy of helium ions for a gold mask, FIG. 14E shows a graph 1420 of the mask thickness as a function of the implantation energy of helium ions for a nickel mask, FIG. 14F shows a graph 1425 of the mask thickness as a function of the implantation energy of helium ions for an aluminum mask, FIG. 14G shows a graph 1430 of the mask thickness as a function of the implantation energy of helium ions for an AZ111 photoresist mask, and FIG. 14H shows a graph 1435 of the mask thickness as a function of the implantation energy of helium ions for an $Si_3N_4$ mask. Based on the data shown in FIGS. 14A-14H, the thickness of the gold or nickel mask may be less than 500 nm, the thickness of the aluminum mask may be less than 1000 nm, the thickness of the AZ111 photoresist mask may be less than 2500 nm, and the thickness of the $Si_3N_4$ hard mask may be less than 800 nm.

Figure 15A:
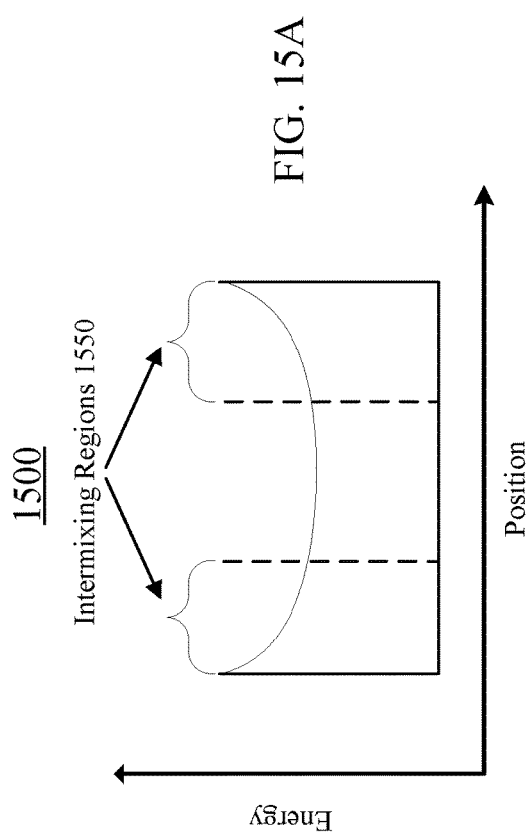
FIGS. 15A and 15B illustrate a method of reducing lateral carrier mobility and surface recombination by using quantum well intermixing to change the composition of areas of the semiconductor layer outside of the central portion of the micro-LED.
Figure 15B:
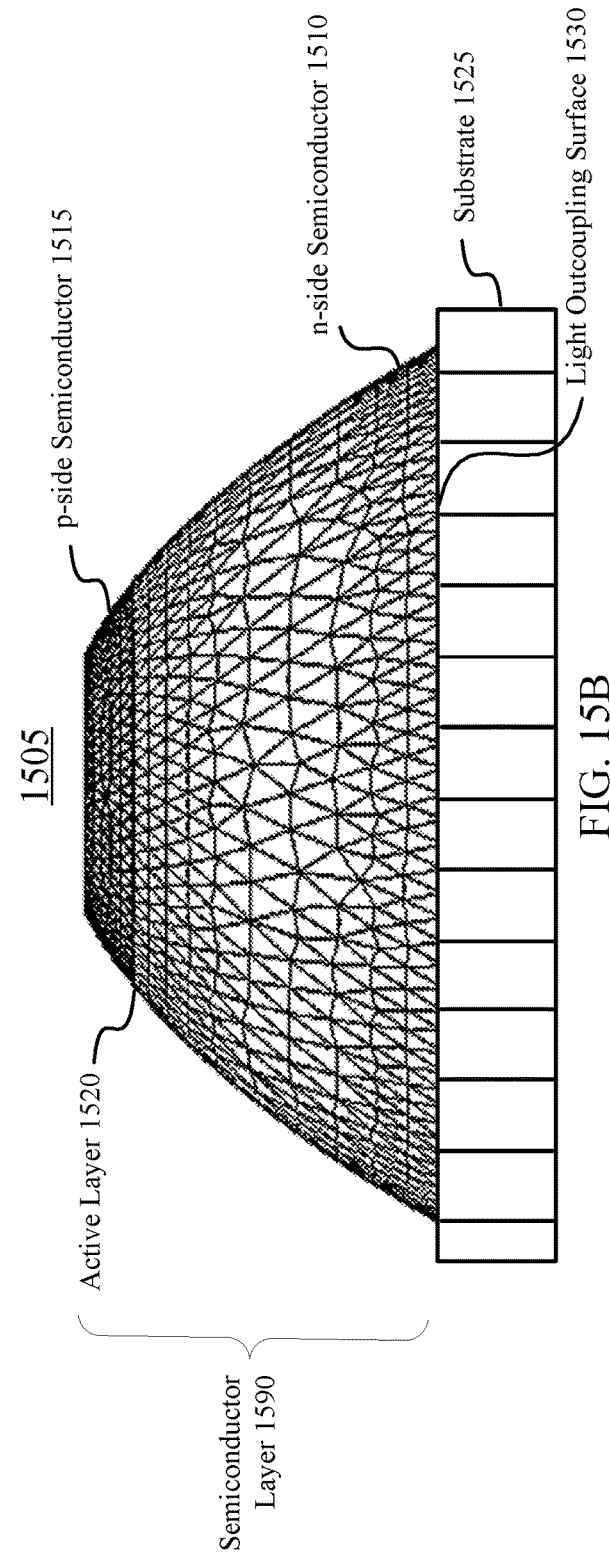

FIGS. 15A and 15B illustrate a method of reducing lateral carrier mobility and surface recombination by using quantum well intermixing to change the composition of areas of the semiconductor layer outside of the central portion of the micro-LED. The quantum well intermixing reduces the number of electrons that reach the outer surface of the micro-LED, and therefore reduces the amount of surface recombination.

FIG. 15A shows a band energy diagram 1500 for a semiconductor material, such as AlInGaP. The band energy diagram 1500 plots energy as a function of position. FIG. 15B shows a corresponding micro-LED 1505 that includes an n-side semiconductor layer 1510, a p-side semiconductor layer 1515, and an active light emitting layer 1520. Together the n-side semiconductor layer 1510, the p-side semiconductor layer 1515, and the active light emitting layer 1520 form a semiconductor layer 1590. The semiconductor layer 1590 may include any suitable material, such as a group III phosphide or a group III arsenide. The semiconductor layer 1590 may have a mesa shape, and the mesa shape may be planar, vertical, conical, semi-parabolic, and/or parabolic. The n-side semiconductor layer 1510 may be formed on a substrate 1525, and may have a light outcoupling surface 1530. In the example shown in FIG. 15B, the semiconductor layer 1590 has a parabolic mesa shape, and the diameter of the light outcoupling surface 1530 is less than 10 μm.

As shown in FIG. 15A, quantum well intermixing may be used to increase the bandgap in an outer region of the semiconductor layer 1590 by implanting ions in the outer region of the semiconductor layer 1590 and subsequently annealing the outer region of the semiconductor layer 1590 to intermix the ions with atoms within the outer region of the semiconductor layer 1590. The ions may be implanted according to the methods discussed above with regard to FIG. 8. For quantum well intermixing, various ions may be used, such as Al ions. The Al ions may be implanted with an energy of approximately 400 keV, which may result in an implantation depth of approximately 460 nm. More generally, the Al ions may be implanted with an energy between 80 keV and 400 keV. The implantation depth may be within the active light emitting layer 1520. The outer region of the semiconductor layer 1590 is shown as intermixing regions 1550 in FIG. 15A.

For example, if the semiconductor layer 1590 is made of AlInGaP, extra Al may be added at the edges of the quantum wells in the intermixing regions 1550. As shown in FIG. 15A, this increases the bandgap at the edges of the quantum wells, such that the band structure is flat in the center, the conduction band bends upward at the edges, and/or the valence band bends downward at the edges (not shown). Accordingly, when electrons are injected from the top of the p-side semiconductor layer 1515, they can freely diffuse in the lateral direction, but are repelled by the higher band structure at the edges, which prevents them from escaping from the side of the structure. For example, the concentration of Al may be increased from 0.3 to 0.5 at the edges of the intermixing regions 1550. The intermixing regions 1550 may form a cross-sectional annular shape.

Figure 16A:
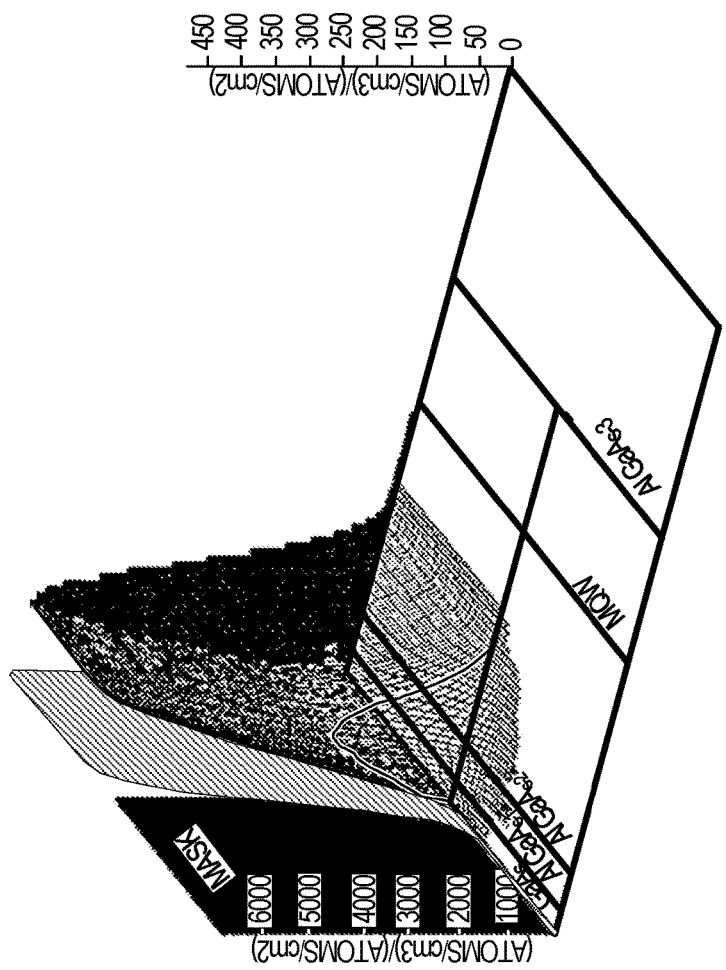
FIGS. 16A-16C show simulations of various ion distributions for the example micro-LED shown in FIG. 15B.
Figure 16B:
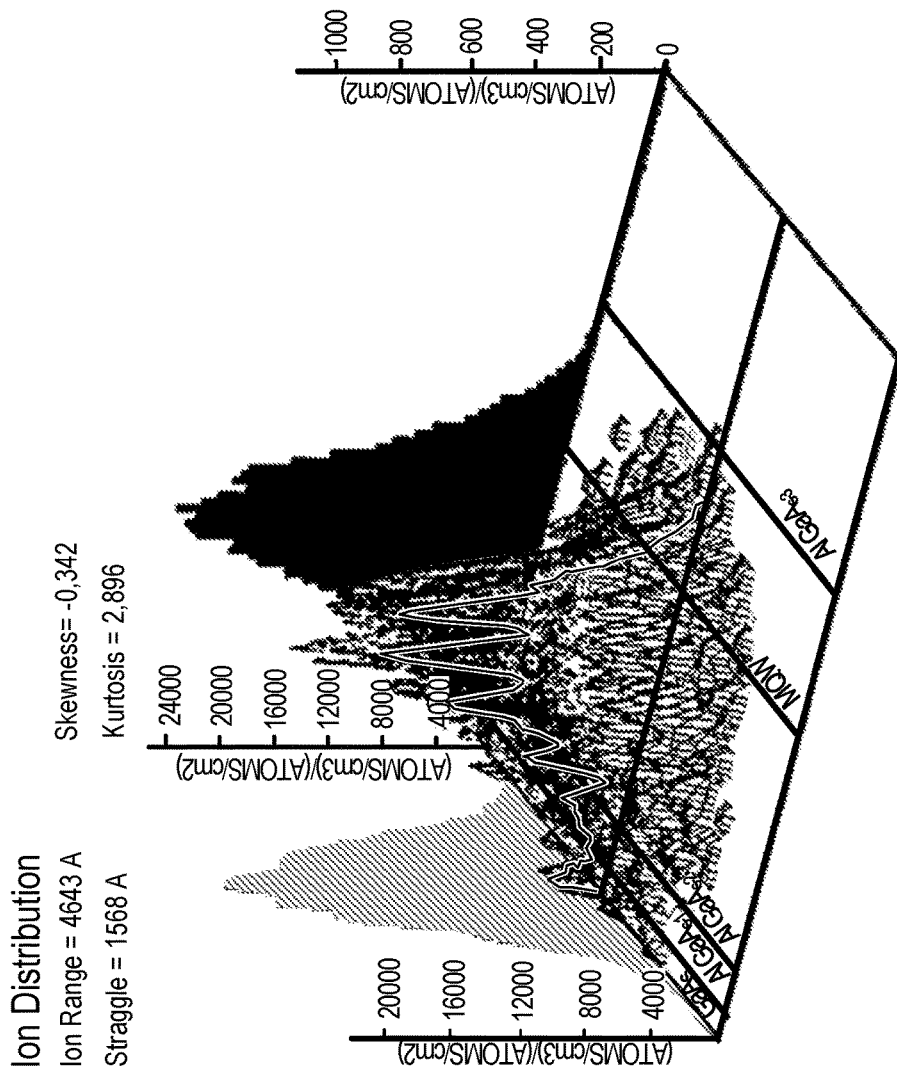
Figure 16C:
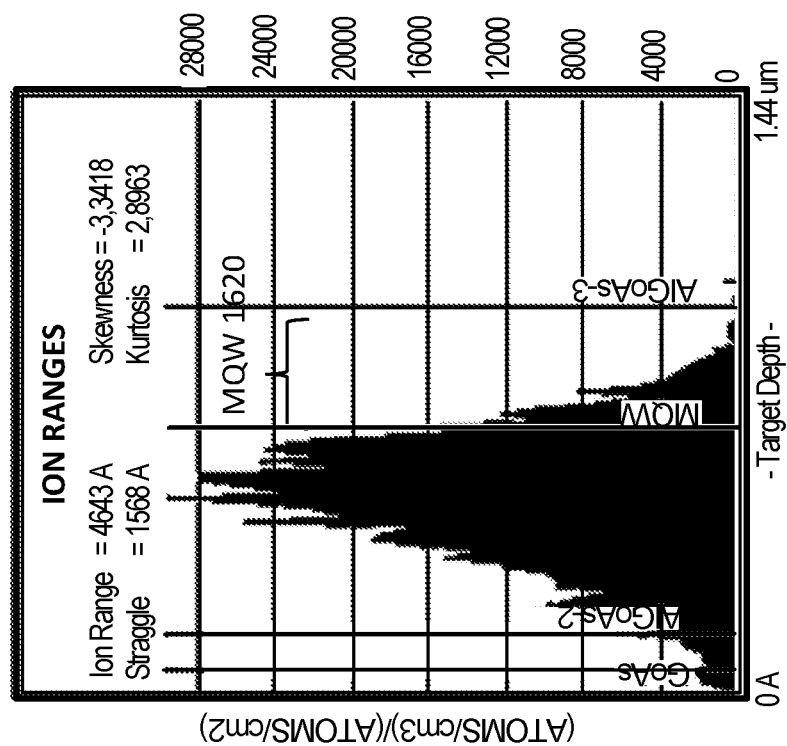

FIGS. 16A-16C show simulations of various ion distributions for the example micro-LED 1505 shown in FIG. 15B. FIG. 16A shows an ion distribution 1600 for Al ions that were implanted with an energy of 140 keV and at an angle of 0° with respect to the axis that is normal to the plane of the mask, FIG. 16B shows an ion distribution 1605 for Al ions that were implanted with an energy of 400 keV and at an angle of 0° with respect to the axis that is normal to the plane of the mask, and FIG. 16C shows a two-dimensional plot 1610 corresponding to the ion distribution 1605 shown in FIG. 16B. FIGS. 16A-16C indicate that implantation depths of 460 nm may be achieved with implantation energies of 400 keV.

The techniques discussed above may also be used to reduce surface recombination losses in LEDs having larger sizes, such as chips having a linear dimension of 25 μm or 50-60 μm. More generally, these larger LEDs may have a linear dimension between 10 μm and 100 μm. For example, implanting hydrogen ions as discussed above may result in LEDs having a higher light output power at a lower current. Accordingly, the techniques discussed above may be used to reduce surface recombination losses in LEDs having various sizes between 0.1 μm and 100 μm.

By performing one or more of the methods discussed above, the surface recombination loss of a micro-LED may be reduced to less than 99%, 80%, 60%, 30%, or 10%. The amount of reduction may be based on the color of the micro-LED and/or the material of the semiconductor layer. For example, the surface recombination loss of a red or IR micro-LED may be reduced to less than 60%-80%, and the surface recombination loss of a blue or green micro-LED may be reduced to less than 60%. Alternatively or in addition, the brightness of a micro-LED may be increased by performing one or more of the methods discussed above. For example, the brightness of a red micro-LED may increase by a factor of 10 with 10× lower current.

Further, the surface recombination velocity may be reduced from $3 \times 10^4$ cm/s to $1\text{-}2 \times 10^4$ cm/s for red micro-LEDs, and the lateral carrier diffusion may be reduced from 20 cm$^2$/s to 0.07 cm$^2$/s for red micro-LEDs. The external quantum efficiency of red micro-LEDs may be increased by a factor of 6 with 10× lower current. The internal quantum efficiency of red micro-LEDs may be up to 80%.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
increasing a bandgap in an outer region of a semiconductor layer by implanting ions in the outer region of the semiconductor layer and subsequently annealing the outer region of the semiconductor layer to intermix the ions with atoms within the outer region of the semiconductor layer, wherein:
the semiconductor layer comprises an active light emitting layer,
a light outcoupling surface of the semiconductor layer has a diameter of less than 10 µm,
the outer region of the semiconductor layer extends from an outer surface of the semiconductor layer to a central region of the semiconductor layer that is shaded by a mask during the implanting of the ions, and
the semiconductor layer further comprises an n-side semiconductor layer adjacent to the light outcoupling surface and a p-side semiconductor layer opposite to the active light emitting layer.

2. The method of claim 1, wherein the ions are implanted from a top surface of the p-side semiconductor layer to a depth of approximately 460 nm within the semiconductor layer.

3. The method of claim 1, wherein the ions are implanted from a top surface of the p-side semiconductor layer to a depth within the active light emitting layer.

4. The method of claim 1, wherein the ions are implanted at an angle between 0° and 7° with respect to an axis that is normal to a plane of the mask.

5. The method of claim 1, wherein the outer region of the semiconductor layer has a cross-sectional annular shape.

6. The method of claim 1, wherein the mask comprises at least one of a metal, a resist, or a hard mask.

7. The method of claim 6, wherein the metal has a thickness of less than 1000 nm, the resist has a thickness of less than 2500 nm, and the hard mask has a thickness of less than 800 nm.

8. The method of claim 1, wherein the ions comprise Al ions.

9. The method of claim 8, wherein a concentration of Al in the outer region of the semiconductor layer is between 0.3 and 0.5.

10. The method of claim 8, wherein the ions have an implantation energy of approximately 400 keV.

11. A light-emitting diode comprising:
a semiconductor layer comprising an active light emitting layer, wherein:
a light outcoupling surface of the semiconductor layer has a diameter of less than 10 µm,
a bandgap in an outer region of the semiconductor layer is greater than a bandgap in a central region of the semiconductor layer,
the outer region of the semiconductor layer comprises ions that are implanted in the outer region of the semiconductor layer and intermixed with atoms within the outer region of the semiconductor layer, and
the semiconductor layer further comprises an n-side semiconductor layer adjacent to the light outcoupling surface and a p-side semiconductor layer opposite to the active light emitting layer.

12. The light-emitting diode of claim 11, wherein the ions are implanted from a top surface of the p-side semiconductor layer to a depth of approximately 460 nm within the semiconductor layer.

13. The light-emitting diode of claim 11, wherein the ions are implanted from a top surface of the p-side semiconductor layer to a depth within the active light emitting layer.

14. The light-emitting diode of claim 11, wherein the outer region of the semiconductor layer has a cross-sectional annular shape.

15. The light-emitting diode of claim 11, wherein the ions comprise Al ions.

16. The light-emitting diode of claim 15, wherein a concentration of Al in the outer region of the semiconductor layer is between 0.3 and 0.5.

17. A light-emitting diode comprising:
a semiconductor layer comprising an active light emitting layer, wherein:
a light outcoupling surface of the semiconductor layer has a diameter of less than 10 µm,
a bandgap in an outer region of the semiconductor layer is greater than a bandgap in a central region of the semiconductor layer,
the outer region of the semiconductor layer comprises ions that are implanted in the outer region of the semiconductor layer and intermixed with atoms within the outer region of the semiconductor layer, and
the ions comprise Al ions.

18. The light-emitting diode of claim 17, wherein:
the semiconductor layer further comprises an n-side semiconductor layer adjacent to the light outcoupling surface and a p-side semiconductor layer opposite to the active light emitting layer, and
the ions are implanted from a top surface of the p-side semiconductor layer to a depth of approximately 460 nm within the semiconductor layer.

19. The light-emitting diode of claim 17, wherein:
the semiconductor layer further comprises an n-side semiconductor layer adjacent to the light outcoupling surface and a p-side semiconductor layer opposite to the active light emitting layer, and
the ions are implanted from a top surface of the p-side semiconductor layer to a depth within the active light emitting layer.

20. The light-emitting diode of claim 17, wherein a concentration of Al in the outer region of the semiconductor layer is between 0.3 and 0.5.

* * * * *